United States Patent
Ha et al.

(10) Patent No.: US 11,672,084 B2
(45) Date of Patent: *Jun. 6, 2023

(54) FOLDABLE DISPLAY DEVICE

(71) Applicant: Samsung Display Co., Ltd., Yongin-si (KR)

(72) Inventors: Seung Hwa Ha, Hwaseong-si (KR); Sang Jae Kim, Yongin-si (KR); Seung-Ho Jung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 71 days.

This patent is subject to a terminal disclaimer.

(21) Appl. No.: 17/168,095

(22) Filed: Feb. 4, 2021

(65) Prior Publication Data

US 2021/0251090 A1 Aug. 12, 2021

(30) Foreign Application Priority Data

Feb. 12, 2020 (KR) .................. 10-2020-0017015

(51) Int. Cl.
*G02F 1/1333* (2006.01)
*H05K 5/00* (2006.01)
*H05K 5/03* (2006.01)
*G06F 1/16* (2006.01)
*B32B 3/26* (2006.01)
*B32B 5/14* (2006.01)
(Continued)

(52) U.S. Cl.
CPC ........... *H05K 5/0017* (2013.01); *B32B 3/266* (2013.01); *B32B 3/30* (2013.01); *B32B 5/142* (2013.01); *B32B 15/04* (2013.01); *G02F 1/133305* (2013.01); *G06F 1/1652* (2013.01); *H05K 5/03* (2013.01); *B32B 2307/51* (2013.01); *B32B 2457/20* (2013.01); *C09K 2323/06* (2020.08); *G02F 2201/503* (2013.01); *G09F 9/301* (2013.01); *H01L 2251/5338* (2013.01)

(58) Field of Classification Search
CPC ........... B32B 3/266; B32B 3/30; B32B 5/142; B32B 15/04; B32B 2307/51; B32B 2457/20; G02F 1/133305; G02F 2215/508; G06F 1/1652; G09F 9/301; H05K 5/03; H01L 2251/5338
USPC ........................................... 428/1.5
See application file for complete search history.

(56) References Cited

U.S. PATENT DOCUMENTS

| 10,115,928 B2 | 10/2018 | Son et al. |
| 10,657,850 B2 | 5/2020 | Kim |
| 2018/0153049 A1* | 5/2018 | Song .................. H05K 5/0017 |

FOREIGN PATENT DOCUMENTS

| KR | 10-2019-0003257 | 1/2019 |
| KR | 10-2019-0049454 | 5/2019 |

(Continued)

*Primary Examiner* — Ruiyun Zhang
(74) *Attorney, Agent, or Firm* — H.C. Park & Associates, PLC

(57) ABSTRACT

A foldable display device may include a display panel, a window disposed on a first surface of the display panel, a metal plate disposed on a second surface of the display panel opposite to the first surface, and a functional member disposed between the display panel and the metal plate, the functional member including a first functional layer in which a plurality of holes are formed and a filler filling each of the holes. An elastic modulus of the filler may be greater than an elastic modulus of the first functional layer.

20 Claims, 18 Drawing Sheets

(51) Int. Cl.
*B32B 15/04* (2006.01)
*B32B 3/30* (2006.01)
*G09F 9/30* (2006.01)

(56) References Cited

FOREIGN PATENT DOCUMENTS

| | | |
|---|---|---|
| KR | 10-2019-0080740 | 7/2019 |
| KR | 10-2019-0098309 | 8/2019 |

* cited by examiner

FOLDABLE DISPLAY DEVICE

CROSS-REFERENCE TO RELATED APPLICATION

This application claims priority from and the benefit of Korean Patent Application No. 10-2020-0017015 filed on Feb. 12, 2020, which is hereby incorporated by reference for all purposes as if fully set forth herein.

BACKGROUND

Field

Exemplary embodiments of the invention relate generally to a display device, and, more particularly, to embodiments relate to a foldable display device.

Discussion of the Background

A display device may provide information to a user by displaying an image. Recently, a flexible display device deformable in various forms has been developed. Unlike a flat panel display, the flexible display device may be folded, bent, or rolled like a paper. The flexible display device can be portable and can improve convenience of the user.

The foldable display device may include a display panel for generating an image and a plurality of layers disposed on and/or under the display panel to provide various functions to the display panel. When the layers are folded several times together with the display panel according to folding of the foldable display device, buckling of the layers may occur.

The above information disclosed in this Background section is only for understanding of the background of the inventive concepts, and, therefore, it may contain information that does not constitute prior art.

SUMMARY

Devices constructed according to exemplary embodiments of the invention are capable of including a functional member in which buckling does not occur.

According to one or more implementations of the invention, a display device includes a display panel, a window disposed on a first surface of the display panel, a metal plate disposed on a second surface of the display panel opposite to the first surface, and a functional member disposed between the display panel and the metal plate, the functional member including a first functional layer in which a plurality of holes are formed and a filler filling each of the holes. An elastic modulus of the filler may be greater than an elastic modulus of the first functional layer.

In an embodiment, the first functional layer may include an elastomer, and the filler may include a metal or a high elastic resin.

In an embodiment, each of the holes may have a circular shape in a plan view.

In an embodiment, a diameter of each of the holes may be from about 4 μm to about 50 μm.

In an embodiment, each of the holes may be a through hole passing through the first functional layer.

In an embodiment, each of the holes may be a recessed hole recessed from a surface of the first functional layer.

In an embodiment, each of the holes may extend parallel to a thickness direction of the first functional layer from a surface of the first functional layer.

In an embodiment, each of the holes may extend obliquely with a thickness direction of the first functional layer from a surface of the first functional layer.

In an embodiment, the display panel may include a first non-bendable portion, a second non-bendable portion, and a bendable portion between the first non-bendable portion and the second non-bendable portion, and the holes may overlap the first non-bendable portion, the second non-bendable portion, and the bendable portion.

In an embodiment, a gap between adjacent holes of the holes may be uniform.

In an embodiment, a gap between adjacent holes of the holes overlapping the bendable portion may be less than a gap between adjacent holes of the holes overlapping the first non-bendable portion and the second non-bendable portion.

In an embodiment, the metal plate may include a patterned portion overlapping the bendable portion.

In an embodiment, the display panel may include a first non-bendable portion, a second non-bendable portion, and a bendable portion between the first non-bendable portion and the second non-bendable portion, and the holes may overlap the bendable portion and may not overlap the first non-bendable portion and the second non-bendable portion.

In an embodiment, the functional member may further include a second functional layer disposed on a first surface of the first functional layer and in which a first opening overlapping at least two of the holes and connecting therebetween is formed, and the filler may fill the first opening.

In an embodiment, the functional member may further include a third functional layer disposed on a second surface of the first functional layer opposite to the first surface and in which a second opening overlapping the first opening is formed, and the filler may fill the second opening.

In an embodiment, the functional member may be a protective film protecting the second surface of the display panel.

In an embodiment, the foldable display device may further include a protective film disposed between the display panel and the metal plate, and a cushion layer disposed between the protective film and the metal plate. The functional member may be disposed between the protective film and the cushion layer or between the cushion layer and the metal plate.

A foldable display device according to an embodiment may include a display panel, a window disposed on a first surface of the display panel, a metal plate disposed on a second surface of the display panel opposite to the first surface, and a functional member disposed between the display panel and the metal plate, the functional member including a functional layer in which a plurality of holes are formed. An inside of each of the holes may be empty.

A foldable display device according to an embodiment may include a display panel, a window disposed on a first surface of the display panel, a metal plate disposed on a second surface of the display panel opposite to the first surface, and a functional member disposed between the display panel and the metal plate, the functional member including a functional layer in which a plurality of holes are formed and a filler filling each of the holes. An elastic modulus of the filler may be less than an elastic modulus of the functional layer.

In an embodiment, the functional layer may include a metal, and the filler may include a polymer.

In the foldable display device according to the embodiments, the functional member may include the functional layer in which the holes are formed, and each of the holes may be filled by the filler having the elastic modulus different from that of the functional layer or the inside of the holes may be empty. Accordingly, although the foldable display device is folded several times, buckling of the functional member may not occur. Further, recognition of wrinkles of the metal plate generated by folding of the foldable display device may be reduced by the functional member.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
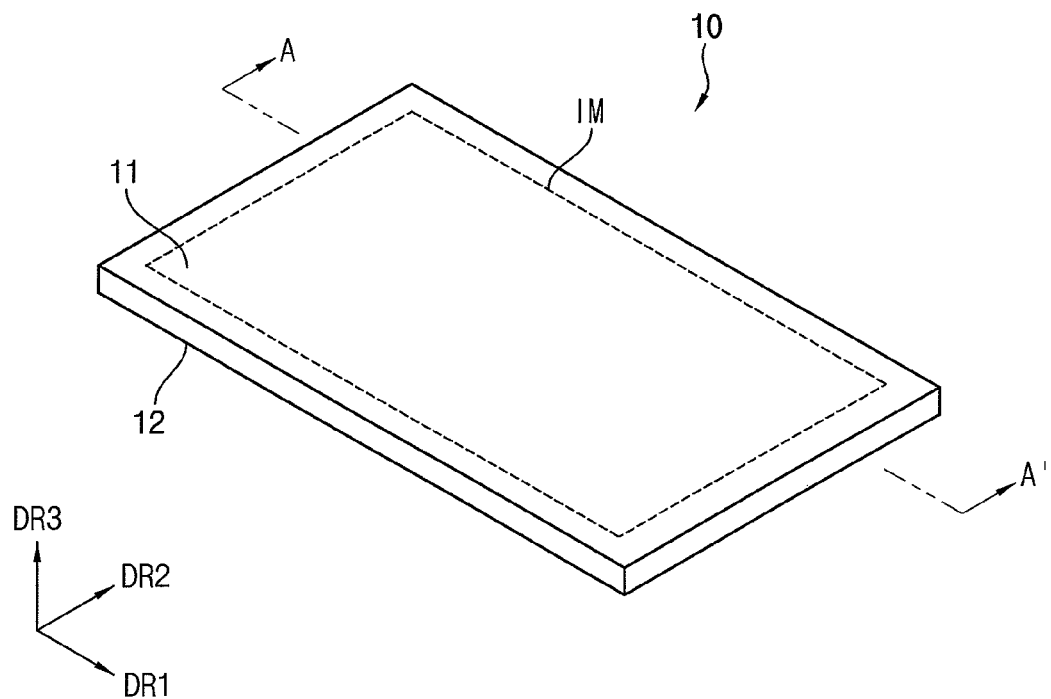
FIG. 1 is a perspective view illustrating an unfolded state of a foldable display device according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, foldable display devices in accordance with embodiments will be explained in detail with reference to the accompanying drawings.

Hereinafter, a foldable display device 10 according to an embodiment will be described with reference to FIGS. 1 to 5.

FIG. 1 is a perspective view illustrating an unfolded state of a foldable display device 10 according to an embodiment.

Referring to FIG. 1, a foldable display device 10 may include a display surface 11 and a back surface 12 opposite to the display surface 11. The display surface 11 and the back surface 12 may be parallel to a plane defined by a first direction DR1 and a second direction DR2 crossing the first direction DR1. The display surface 11 may be positioned in a third direction DR3 crossing the first direction DR1 and the second direction DR2 from the back surface 12. In other words, the display surface 11 may be positioned in a thickness direction of the foldable display device 10 from the back surface 12.

The foldable display device 10 may provide an image IM to a user through the display surface 11. In other words, the display surface 11 may be a surface on which the image IM is displayed. In an embodiment, the back surface 12 may be a non-display surface on which an image is not displayed. However, the present invention is not limited thereto, and in another embodiment, the back surface 12 may be a display surface on which an image is displayed. In such another embodiment, the foldable display device 10 may display an image toward opposite surfaces.

Figure 2:
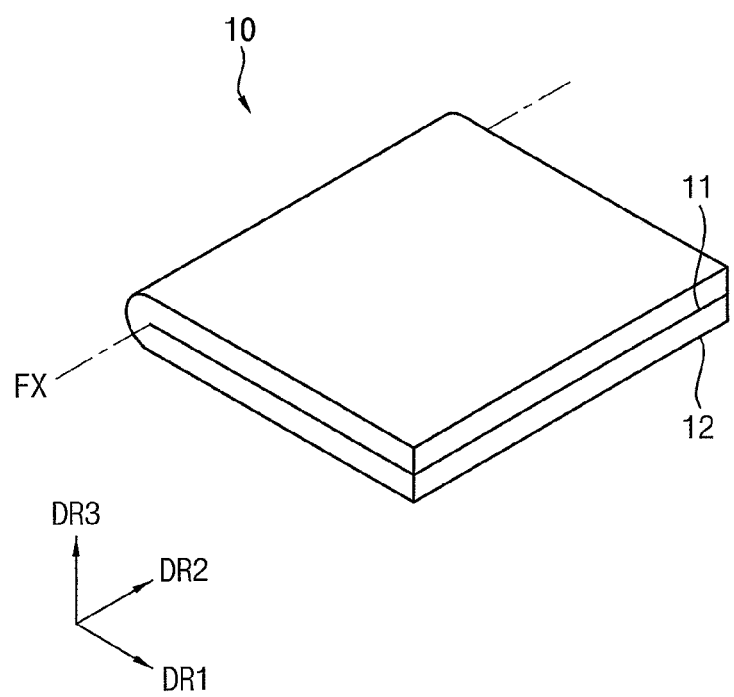
FIG. 2 is a perspective view illustrating a folded state of the foldable display device in FIG. 1.

FIG. 2 is a perspective view illustrating a folded state of the foldable display device 10 in FIG. 1.

Referring to FIG. 2, in an embodiment, the foldable display device 10 may be in-folded with respect to a folding axis FX. In such an embodiment, the foldable display device 10 may be folded such that portions of the display surface 11 face each other. Because the display surface 11 of the foldable display device 10 is not exposed to an outside environment in the in-folded state, the display surface 11 may be protected from impact, contact, etc. from the outside. However, the present invention is not limited thereto, and in another embodiment, the foldable display device 10 may be out-folded with respect to the folding axis FX such that the display surface 11 faces outwards. In such another embodiment, the foldable display device 10 may be folded such that portions of the back surface 12 face each other.

Figure 3:
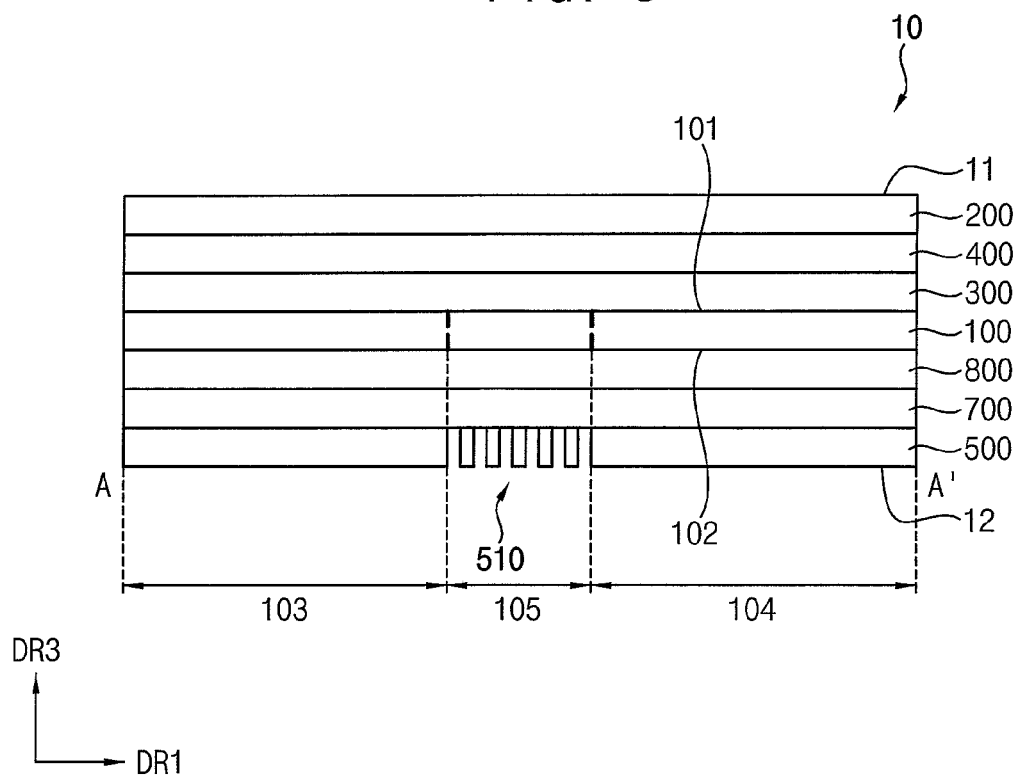
FIGS. 3, 4, and 5 are cross-sectional views illustrating a foldable display device according to exemplary embodiments of the invention.
Figure 4:
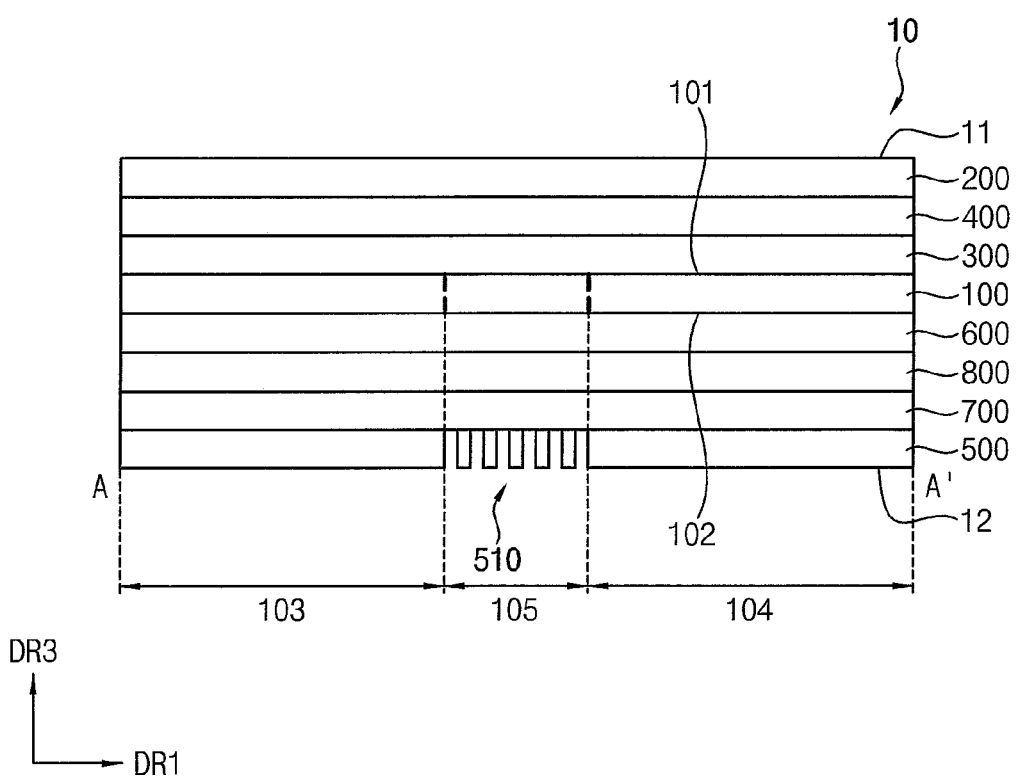
Figure 5:
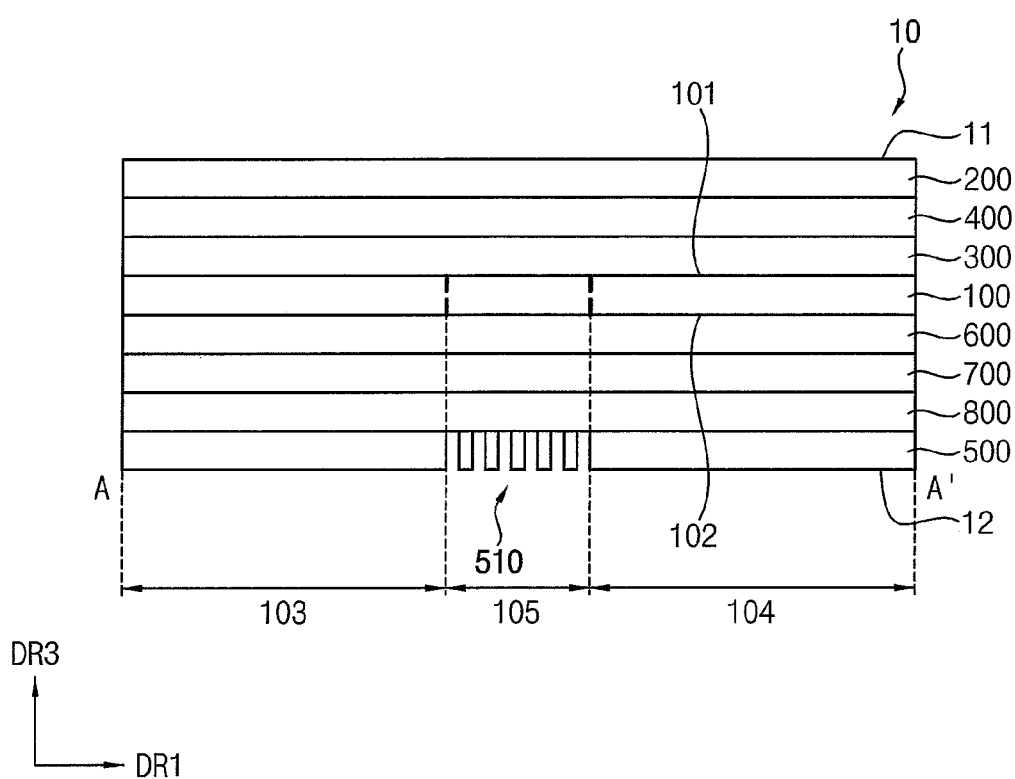

FIGS. 3, 4, and 5 are cross-sectional views illustrating a foldable display device according to embodiments. For example, FIGS. 3 to 5 are cross-sectional views taken along a line A-A' in FIG. 1.

Referring to FIG. 3, the foldable display device 10 may include a display panel 100, a window 200, a polarization layer 300, an impact absorbing layer 400, a metal plate 500, a cushion layer 700, and a functional member 800. As described above, because the foldable display device 10 may be folded or unfolded, each of the display panel 100, the window 200, the polarization layer 300, the impact absorbing layer 400, the metal plate 500, the cushion layer 700, and the functional member 800 may have flexible characteristics.

The display panel 100 may include a plurality of pixels, and may generate an image formed by combining light beams emitted from the pixels. The display panel 100 may include a first surface 101 and a second surface 102 that are opposite to each other. For example, the first surface 101 and the second surface 102 may be an upper surface and a lower surface of the display panel 100, respectively. The display panel 100 may display the image toward the first surface 101.

The display panel 100 may include a first non-bendable portion 103, a second non-bendable portion 104, and a bendable portion 105. The second non-bendable portion 104 may be positioned in the first direction DR1 from the first non-bendable portion 103, and the bendable portion 105 may be positioned between the first non-bendable portion 103 and the second non-bendable portion 104. The first non-bendable portion 103 and the second non-bendable portion 104 may be portions that are not bent in the display panel 100. Though the non-bendable portions 103 and 104 may be folded about the axis FX, they are not bent within respective regions 103 or 104. The bendable portion 105 may be a portion that is bent, or folded, in the display panel 100. When the bendable portion 105 of the display panel 100 is bent, the window 200, the polarization layer 300, the impact absorbing layer 400, the metal plate 500, the cushion layer 700, and the functional member 800 within the bendable portion 105 and disposed on the first surface 101 or the second surface 102 of the display panel 100 may also be bent according to bending of the display panel 100.

The window 200 may be disposed on the first surface 101 of the display panel 100. In other words, the window 200 may be disposed over the display panel 100. The window 200 may protect the display panel 100 from external impact, and may transmit the image displayed from the display panel 100. In an embodiment, the windows 200 may include polymer resin such as polycarbonate (PC), polymethyl methacrylate (PMMA), polyarylate (PAR), polyethersulfone (PES), polyethylene terephthalate (PET), or polyethylene naphthalate (PEN), glass and the like.

The polarization layer 300 may be disposed between the display panel 100 and the window 200. The polarization layer 300 may be disposed on the first surface 101 of the display panel 100. The polarization layer 300 may reduce a reflection of external light of the foldable display device 10. For example, when the external light passes through the polarization layer 300, is reflected from a lower portion of the polarization layer 300 (for example, the display panel 100), and passes through the polarization layer 300 again, the external light passes through the polarization layer 300 twice, and thus a phase of the external light may be changed. Accordingly, the phase of the reflected light is different from the phase of the incident light entering the polarization layer 300, so that destructive interference may occur, and the reflection of the external light decreases, so that the visibility of the foldable display device 10 may be improved.

The impact absorbing layer 400 may be disposed between the window 200 and the polarization layer 300. The impact absorbing layer 400 may absorb external impact. For example, when the external impact is applied through the display surface 11 of the foldable display device 10, the impact absorbing layer 400 may absorb the impact to prevent the impact from being transferred to the display panel 100.

The metal plate 500 may be disposed on the second surface 102 of the display panel 100. In other words, the metal plate 500 may be disposed under the display panel 100. The metal plate 500 may support the display panel 100, may release or disperse heat generated from the display panel 100, and may prevent impurities from being flowed into the display panel 100. The metal plate 500 may include at least one of stainless steel (SUS), copper (Cu), and graphite. The metal plate 500 may be spaced apart from the display panel 100 by layers such as a cushion layer 700 and a functional member 800.

The metal plate 500 may include a patterned portion 510 overlapping the bendable portion 105 of the display panel 100. Holes arranged along the first direction DR1 and the second direction DR2 may be formed in the patterned portion 510. The metal plate 500 may include the patterned portion 510 overlapping the bendable portion 105, so that the metal plate 500 including a relatively rigid metal may be bent according to bending of the display panel 100. The patterned portion 510 is configured to facilitate bending of the bendable portion 105.

The cushion layer 700 may be disposed between the display panel 100 and the metal plate 500. The cushion layer 700 may absorb external impact. For example, when the external impact is applied through the back surface 12 of the foldable display device 10, the cushion layer 700 may absorb the impact to prevent the impact from being transferred to the display panel 100.

The functional member 800 may be disposed between the display panel 100 and the metal plate 500.

As illustrated in FIG. 3, in an embodiment, the functional member 800 may be disposed on the second surface 102 of the display panel 100. In such an embodiment, the functional member 800 may be a protective film protecting the second surface 102 of the display panel 100.

Referring to FIGS. 4 and 5, in another embodiment, the foldable display device 10 may further include a protective film 600 disposed between the display panel 100 and the cushion layer 700 to protect the second surface 102 of the display panel 100, and the functional member 800 may be disposed between the protective film 600 and the cushion layer 700 as illustrated in FIG. 4 or between the metal plate 500 and the cushion layer 700 as illustrated in FIG. 5. In such another embodiment, the functional member 800 may absorb external impact applied through the back surface 12 of the foldable display device 10.

Although it is not illustrated in FIGS. 3 to 5, the foldable display device 10 may further include an input sensing layer disposed between the display panel 100 and the polarization layer 300. The input sensing layer may sense an external input such as an external object that comes into contact with or approaches the foldable display device 10. For example, the input sensing layer may sense the external input by using a capacitive scheme.

Hereinafter, the display panel 100 according to an embodiment will be described with reference to FIGS. 6 and 7.

Figure 6:
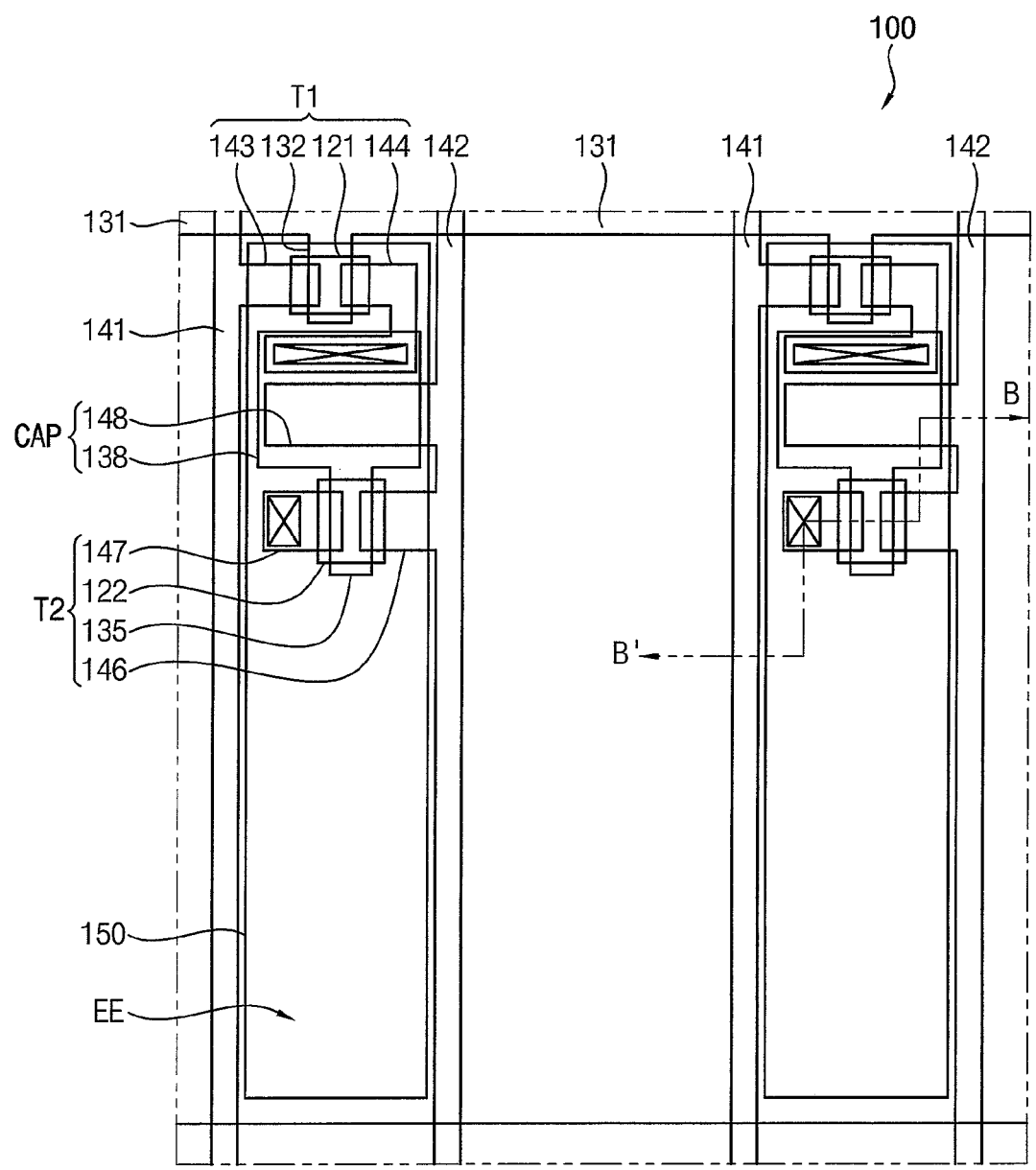
FIG. 6 is a plan view illustrating a display panel according to an exemplary embodiment of the invention.

FIG. 6 is a plan view illustrating a display panel 100 according to an embodiment. For example, FIG. 6 may illustrate the display panel 100 in FIGS. 3 to 5. FIG. 7 is a cross-sectional view taken along a line B-B' in FIG. 6.

Figure 7:
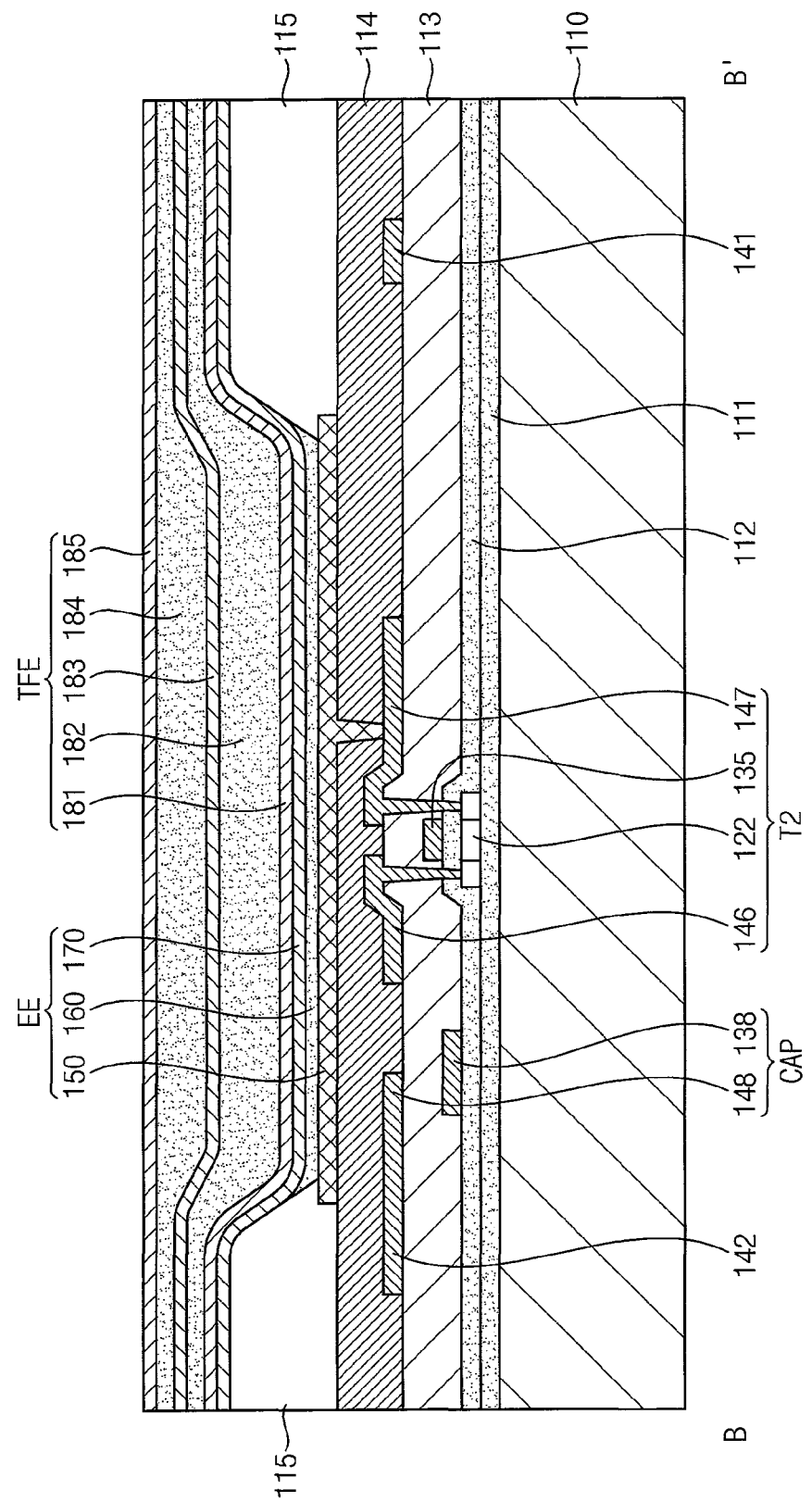
FIG. 7 is a cross-sectional view taken along a line B-B' in FIG. 6.

Referring to FIGS. 6 and 7, the display panel 100 may include a plurality of pixels in which each of the pixels includes a switching thin film transistor T1, a driving thin film transistor T2, a capacitor CAP, and a light emitting element EE. The pixel denotes a minimum unit configured to display an image, and the display panel 100 may display the image through the pixels.

Although FIGS. 6 and 7 illustrate that two thin film transistors and one capacitor are disposed in one pixel, the present invention is not limited thereto, and one pixel may be provided with at least three thin film transistors and/or at least two capacitors.

The display panel 100 may include a substrate 110, a gate line 131 disposed on the substrate 110, a data line 141 insulated from and intersected with the gate line 131, and a common power line 142. In general, one pixel may be defined by a boundary between the gate line 131, the data line 141, and the common power line 142, but the pixel is not limited to the above-described definition. The pixel may be defined by a black matrix or a pixel defining layer.

The substrate 110 may include a flexible material such as plastic. For example, the substrate 110 may be formed of polyethersulfone (PES), polycarbonate (PC), polyimide (PI), polyethylene terephthalate (PET), polyethylene naphthalate (PEN), polyacrylate (PAR), fiber reinforced plastic (FRP), or the like.

The substrate 110 may have a thickness of about 5 μm to about 200 μm. When the substrate 110 has a thickness less than about 5 μm, it may be difficult for the substrate 110 to stably support the light emitting element EE. In addition, when the substrate 110 has a thickness greater than about 200 μm, the flexible characteristics of the substrate 110 may be deteriorated.

The buffer layer 111 may be disposed on the substrate 110. The buffer layer 111 may serve to prevent the penetration of impurities and planarize a surface. The buffer layer 111 may be formed of silicon nitride, silicon oxide, silicon oxynitride, or the like. However, the buffer layer 111 is not necessarily required, and may be omitted according to a type of the substrate 110 and processing conditions.

A switching semiconductor layer 121 and a driving semiconductor layer 122 may be disposed on the buffer layer 111. The switching semiconductor layer 121 and the driving semiconductor layer 122 may be formed of one of polycrystalline silicon, amorphous silicon, and oxide semiconductors such as indium gallium zinc oxide (IGZO), indium zinc tin oxide (IZTO) or the like. For example, when the driving semiconductor layer 122 is formed of polycrystalline silicon, the driving semiconductor layer 122 may include a channel region that is not doped with impurities, and a source region and a drain region that are formed by doping impurities on opposite sides of the channel region. In this case, the doped impurities are P-type impurities such as boron (B), and $B_2H_6$ may be mainly used. The impurities may vary depending on the type of thin film transistor. Although the thin film transistor having a PMOS structure using the P-type impurities is used as the driving thin film transistor T2 in this embodiment, the driving thin film transistor T2 is not limited thereto, and a thin film transistor having an NMOS structure or a CMOS structure may be used as the driving thin film transistor T2.

A gate insulating layer 112 may be disposed on the switching semiconductor layer 121 and the driving semiconductor layer 122. The gate insulating layer 112 may be formed of tetraethoxysilane (TEOS), silicon nitride, silicon oxide, or the like. In an embodiment, the gate insulating layer 112 may have a double-layer structure in which a silicon nitride layer having a thickness of about 40 nm and a tetraethoxysilane layer having a thickness of about 80 nm are sequentially stacked.

A gate wiring including gate electrodes 132 and 135 may be disposed on the gate insulating layer 112. The gate wiring may further include the gate line 131, a first power storage plate 138, and the like. The gate electrodes 132 and 135 may be disposed to overlap at least a portion (e.g., the channel region) of the semiconductor layers 121 and 122. When the impurities are doped in the source region and the drain region of the semiconductor layers 121 and 122 in the process of forming the semiconductor layers 121 and 122, the gate electrodes 132 and 135 may serve to block the impurities from being doped in the channel region.

The gate electrodes 132 and 135 and the first power storage plate 138 may be disposed on the same layer, and may be formed of substantially the same metal. For example, the gate electrodes 132 and 135 and the first power storage plate 138 may be formed of molybdenum (Mo), chromium (Cr), tungsten (W), or the like.

An interlayer insulating layer 113 covering the gate electrodes 132 and 135 may be disposed on the gate insulating layer 112. Like the gate insulating layer 112, the interlayer insulating layer 113 may be formed of tetraethoxysilane, silicon nitride, silicon oxide, or the like, but the material of the interlayer insulating layer 113 is not limited thereto.

Data wirings including source electrodes 143 and 146 and drain electrodes 144 and 147 may be disposed on the interlayer insulating layer 113. The data wiring may further include the data line 141, the common power line 142, a second power storage plate 148, and the like. The source electrodes 143 and 146 and the drain electrodes 144 and 147 may be connected to the source region and the drain region of the semiconductor layers 121 and 122 through contact holes formed in the gate insulating layer 112 and the interlayer insulating layer 113, respectively.

The switching thin film transistor T1 may include the switching semiconductor layer 121, a switching gate electrode 132, a switching source electrode 143, and a switching drain electrode 144, and the driving thin film transistor T2 may include the driving semiconductor layer 122, a driving gate electrode 135, a driving source electrode 146, and a driving drain electrode 147. In addition, the capacitor CAP may include the first power storage plate 138 and the second power storage plate 148 that are disposed with the interlayer insulating layer 113 therebetween.

The switching thin film transistor T1 may be used as a switching element configured to select a pixel configured to emit light. The switching gate electrode 132 may be connected to the gate line 131. The switching source electrode 143 may be connected to the data line 141. The switching drain electrode 144 may be spaced apart from the switching source electrode 143 and connected to the first power storage plate 138.

The driving thin film transistor T2 may apply a driving power, which allows the light emitting layer 160 of the light emitting element EE in the selected pixel, to the pixel electrode 150. The driving gate electrode 135 may be connected to the first power storage plate 138. The driving source electrode 146 and the second power storage plate 148 may be connected to the common power line 142. The driving drain electrode 147 may be connected to the pixel electrode 150 of the light emitting element EE through a contact hole.

According to the above structure, the switching thin film transistor T1 may be operated by a gate voltage applied to the gate line 131, thereby serving to transfer the data voltage applied to the data line 141 to the driving thin film transistor T2. A voltage corresponding to a difference between the common voltage applied from the common power line 142 to the driving thin film transistor T2 and the data voltage transferred from the switching thin film transistor T1 may be stored in the capacitor CAP, and a current corresponding to the voltage stored in the capacitor CAP flows into the light emitting element EE through the driving thin film transistor T2, so that the light emitting element EE may emit light.

A planarization layer 114 may be disposed on the interlayer insulating layer 113 to cover the data wirings patterned on the same layer as the data line 141, the common power line 142, the source electrodes 143 and 146, the drain electrodes 144 and 147, and the second power storage plate 148.

The planarization layer 114 may serve to remove and planarize operations to increase the luminance efficiency of the light emitting element EE formed thereon. The planarization layer 114 may be formed of acrylic-based resin (polyacrylates resin), epoxy resin, phenolic resins, polyamide-based resin, polyimide-based resin, unsaturated polyester-based resin, polyphenylene-based resin, polyphenylene sulfide-based resin, benzocyclobutene (BCB), or the like.

The pixel electrode 150 of the light emitting element EE may be disposed on the planarization layer 114. The pixel electrode 150 may be connected to the drain electrode 147 through a contact hole formed in the planarization layer 114.

A pixel defining layer 115 may be disposed on the planarization layer 114 to expose at least a portion of the pixel electrode 150 so as to define a pixel region. The pixel electrode 150 may be disposed to correspond to the pixel region of the pixel defining layer 115. The pixel defining layer 115 may be formed of polyacrylate-based resin, polyimide-based resin, or the like.

The light emitting layer 160 may be disposed on the pixel electrode 150 in the pixel region, and the common electrode 170 may be disposed on the pixel defining layer 115 and the light emitting layer 160. The light emitting layer 160 may be formed of a low molecular organic material or a high molecular organic material. At least one of a hole injection layer (HIL) and a hole transport layer (HTL) may be further disposed between the pixel electrode 150 and the light emitting layer 160, and at least one of an electron transport layer (ETL) and an electron injection layer (EIL) may be further disposed between the light emitting layer 160 and the common electrode 170.

Each of the pixel electrode 150 and the common electrode 170 may be formed as any one of a transmissive electrode, a transflective electrode, and a reflective electrode.

Transparent conductive oxide (TCO) may be used to form the transmissive electrode. The transparent conductive oxide (TCO) may include indium tin oxide (ITO), indium zinc oxide (IZO), zinc oxide (ZnO), indium oxide ($In_2O_3$), and the like.

In order to form the transflective electrode and the reflective electrode, metal such as magnesium (Mg), silver (Ag), gold (Au), calcium (Ca), lithium (Li), chromium (Cr), aluminum (Al), copper (Cu), or an alloy thereof may be used. The determination between the transflective electrode and the reflective electrode may depend on a thickness. In general, the transflective electrode may have a thickness of about 200 nm or less, and the reflective electrode may have a thickness of about 300 nm or more. The transflective electrode may have a higher light transmittance but have a higher resistance as the thickness decreases, and may have a lower light transmittance as the thickness increases. In addition, the transflective electrode and the reflective electrode may be formed in a multilayer structure including a metal layer formed of metal or a metal alloy and a transparent conductive oxide layer stacked on the metal layer.

A thin film encapsulation layer TFE may be disposed on the common electrode 170. The thin film encapsulation layer TFE may include at least one inorganic layer 181, 183, and 185, and at least one organic layer 182 and 184. The thin film encapsulation layer TFE may have a structure in which the inorganic layers 181, 183 and 185 and the organic layers 182 and 184 are alternately stacked. In this case, the inorganic layer 181 may be disposed at the bottom. In other words, the inorganic layer 181 may be disposed most adjacent to the light emitting element EE.

Although FIG. 7 illustrates that the thin film encapsulation layer TFE includes three inorganic layers 181, 183 and 185 and two organic layers 182 and 184, the present invention is not limited thereto.

The inorganic layers 181, 183 and 185 may be formed of at least one inorganic material of $Al_2O_3$, $TiO_2$, $ZrO$, $SiO_2$, AlON, AlN, SiON, $Si_3N_4$, ZnO, and $Ta_2O_5$. The inorganic layers 181, 183 and 185 may be formed through chemical vapor deposition (CVD) or atomic layer deposition (ALD). The inorganic layers 181, 183 and 185 may mainly block the penetration of moisture or oxygen. The inorganic layers 181, 183 and 185 may block most of the moisture and oxygen from penetrating into the light emitting element EE.

The organic layers 182 and 184 may be formed of a polymer-based material. The polymer-based material may include acrylate-based resin, epoxy-based resin, polyimide, polyethylene, and the like. In addition, the organic layers 182 and 184 may be formed through a thermal deposition process. The thermal deposition process to form the organic layers 182 and 184 may be performed within a temperature range that does not damage the light emitting element EE.

The thin film encapsulation layer TFE may have a thickness of about 10 μm or less. Accordingly, the overall thickness of the display panel 100 may be formed to be very thin. As such, the thin film encapsulation layer TFE may be disposed on the light emitting element EE, so that the flexible characteristics of the display panel 100 may be maximized.

Hereinafter, a functional member according to embodiments will be described with reference to FIGS. 8 to 18.

Figure 8:
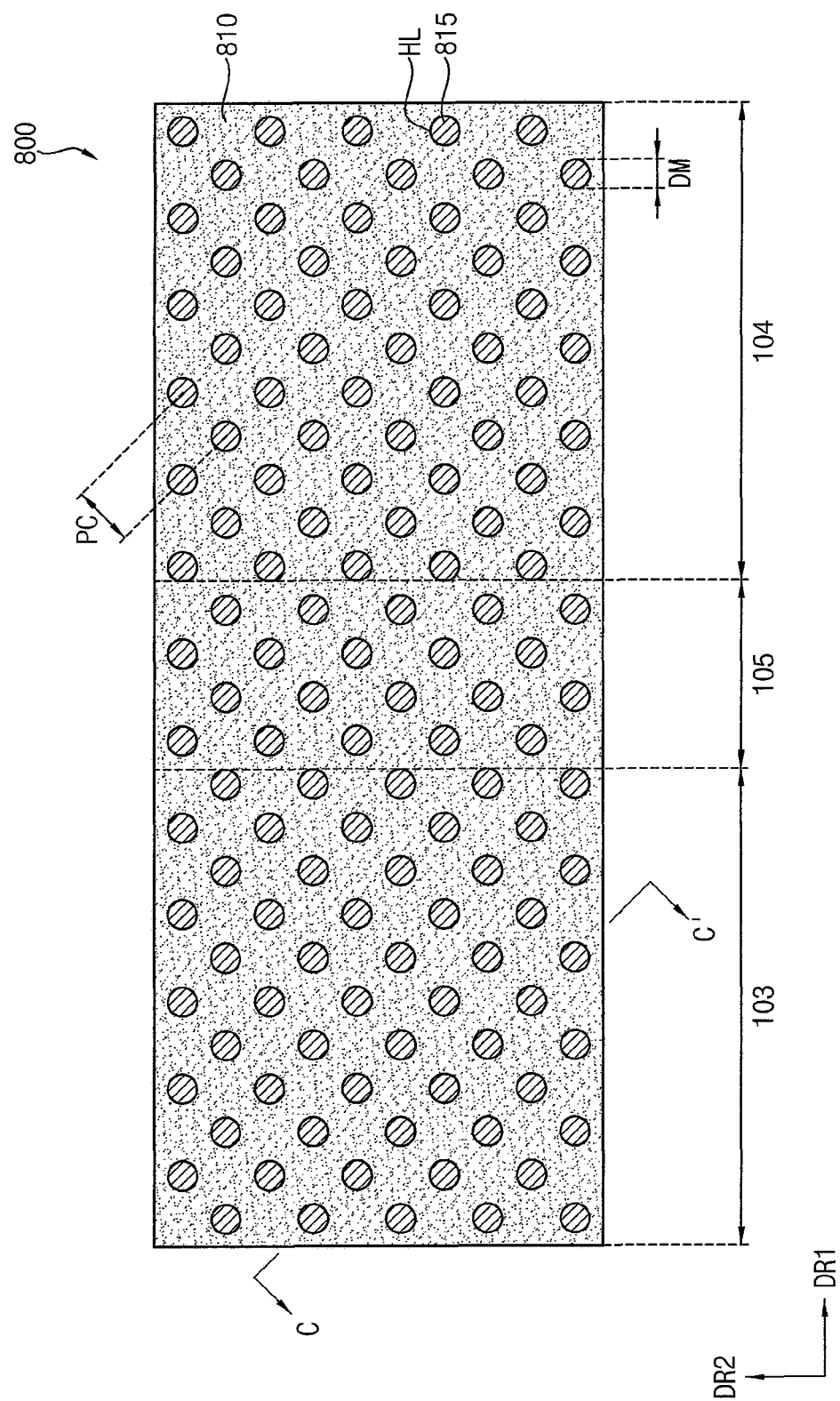
FIG. 8 is a plan view illustrating a functional member according to an exemplary embodiment of the invention.
Figure 9:
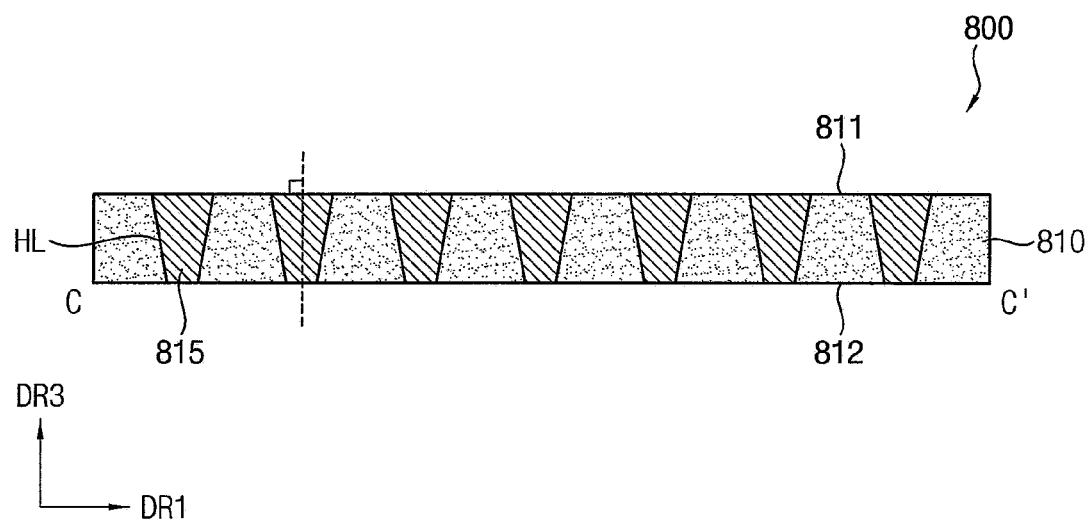
FIG. 9 is a cross-sectional view taken along a line C-C' in FIG. 8.

FIG. 8 is a plan view illustrating a functional member 800 according to an embodiment. FIG. 9 is a cross-sectional view taken along a line C-C' in FIG. 8.

Referring to FIGS. 8 and 9, the functional member 800 may include a first functional layer 810 and a filler 815. A plurality of holes HL may be formed in the first functional layer 810, and the filler 815 may fill each of the holes HL. Accordingly, the functional member 800 may include the first functional layer 810 and a plurality of fillers 815 respectively filling the holes HL.

An elastic modulus of the filler 815 may be greater than an elastic modulus of the first functional layer 810. In other words, the first functional layer 810 may have a relatively low elastic modulus, and the filler 815 may have a relatively high elastic modulus. In an embodiment, the elastic modulus of the first functional layer 810 may be less than about 1 GPa, and the elastic modulus of the filler 815 may be greater than or equal to about 1 GPa. An impact resistance of the functional member 800 may be improved when the functional member 800 includes only the first functional layer 810 because the elastic modulus of the first functional layer 810 is relatively low, however, buckling of the functional member 800 may occur when a stress (e.g., a tensile stress) is applied to the functional member 800 according to folding of the foldable display device. However, in the present embodiment, because the functional member 800 includes the filler 815 filling each of the holes HL of the first functional layer 810 that has a relatively high elastic modulus, the buckling of the functional member 800 may be prevented. The buckling may be prevented even though stress is applied to the functional member 800 during folding of the foldable display device.

In an embodiment, the first functional layer 810 may include elastomer, and the filler 815 may include metal or high elastic resin. For example, the elastomer may be polyamide (PA) or polyurethane (PU), the metal may be copper (Cu), brass, gold (Au), silver (Ag), aluminum (Al) or stainless steel (SUS), and the high elastic resin may be polyimide (PI), polyethylene terephthalate (PET) or engineering plastics. In such an embodiment, the holes HL may be formed by a laser cutting in the first functional layer 810, and the holes HL may be filled by the metal or the high elastic resin.

In an embodiment, each of the holes HL may have a circular shape in a plan view. In other words, the filler 815 filling each of the holes HL may have a circular shape in a plan view. However, the present invention is not limited thereto, and in another embodiment, each of the holes HL may have a polygonal shape such as a rectangular shape or the like in a plan view.

In an embodiment, a diameter DM of each of the holes HL may be from about 4 μm to about 50 μm. In other words, a diameter DM of the filler 815 filling each of the holes HL may be from about 4 μm to about 50 μm. When the diameter of each of the holes HL is less than about 4 μm, a material to form the filler 815 may not be injected into the hole HL in the process of forming the filler 815 because an area of the hole HL may be too small. Further, when the diameter of each of the holes HL is greater than about 50 μm, external impact may be transferred to the display panel 100 in FIG. 3 through the filler 815 having a relatively high elastic modulus because an area of the filler 815 filling the hole HL is too large.

In an embodiment, as illustrated in FIG. 9, each of the holes HL may have a trapezoid shape in a cross-sectional view. In other words, the filler 815 filling each of the holes HL may have a trapezoid shape in a cross-sectional view. For example, the holes HL may be formed by a laser cutting to irradiate with a laser beam, therefore, the hole HL having a trapezoid shape in which a width of a portion where the laser beam is irradiated first is greater than a width of a portion where the laser beam is irradiated later may be formed.

In an embodiment, each of the holes HL may be a through hole passing through the first functional layer 810. The first functional layer 810 may have a first surface 811 and a second surface 812 opposite to each other in the third direction DR3, and the hole HL may pass through the first functional layer 810 in the third direction DR3. Accordingly, the filler 815 may have a thickness in the third direction DR3 corresponding to a vertical distance between the first surface 811 and the second surface 812. A wider edge of the trapezoid shape may lay along the first surface 811 and a narrower edge of the trapezoid shape may lay along the second surface 812.

In an embodiment, each of the holes HL may extend parallel to a thickness direction of the first functional layer 810 from a surface of the first functional layer 810. In other words, each of the holes HL may extend in the third direction DR3 from the first surface 811 of the first functional layer 810. For example, a direction in which each of the holes HL extends from the first surface 811 of the first functional layer 810 may be perpendicular to the first surface 811.

In an embodiment, the holes HL may overlap the first non-bendable portion 103, the second non-bendable portion 104, and the bendable portion 105 of the display panel 100. In other words, the fillers 815 respectively filling the holes HL may overlap the first non-bendable portion 103, the second non-bendable portion 104, and the bendable portion 105 of the display panel 100.

When the bendable portion 105 of the display panel 100 is bent several times, wrinkles may be generated in the patterned portion 510 in FIG. 3 of the metal plate 500 in FIG. 3 overlapping the bendable portion 105, and the wrinkles of the patterned portion 510 may be recognized by a user. However, in the present embodiment, the functional member 800 may be disposed between the display panel 100 and the metal plate 500, and the fillers 815 may overlap the bendable portion 105 of the display panel 100. The fillers 815 and the material disposed therein function to reduce the number of wrinkles of the patterned portion 510 of the metal plate 500 that may be recognizable by a user. The fillers 815 of the functional member 800 may be recognized to the user through the holes of the patterned portion 510 of the metal plate 500. The fillers 815 of the functional member 800 may be recognized to the user together with the wrinkles of the patterned portion 510 of the metal plate 500, so that recognition of the wrinkles of the patterned portion 510 of the metal plate 500 to the user may be relatively reduced. The fillers 815 may be aligned with the holes of the patterned portion 510 such that when viewed through the patterned portion 510, a user may see the fillers 815.

In an embodiment, a pitch PC between the holes HL may be uniform. The pitch PC between the holes HL may be a gap between adjacent holes HL of the holes HL. For example, the pitch PC between the holes HL may be a distance from a center of a hole HL to a center of another adjacent hole HL. For example, the pitch PC between the holes HL may be about 200 μm.

Figure 10:
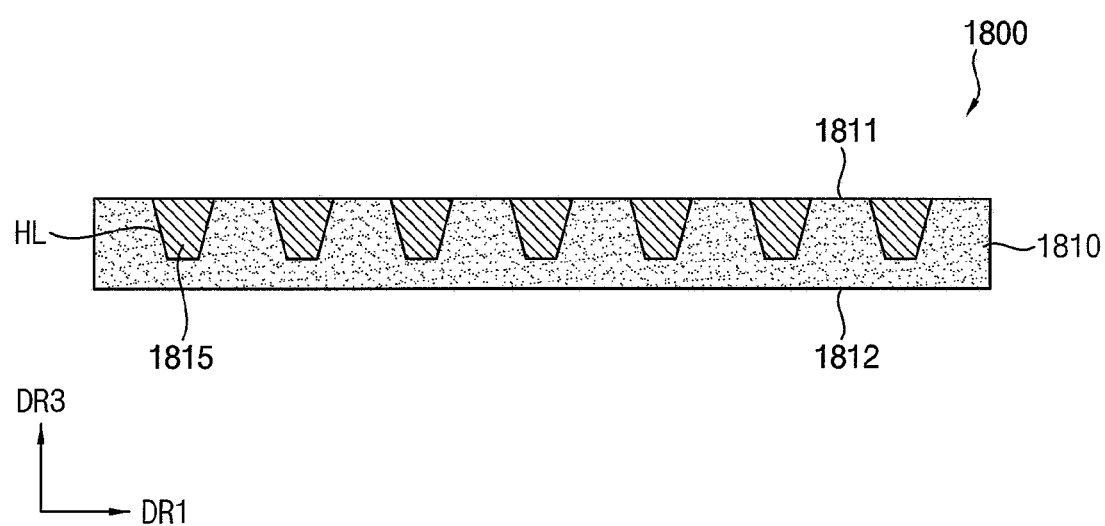
FIG. 10 is a cross-sectional view illustrating a functional member according to an exemplary embodiment of the invention.

FIG. 10 is a cross-sectional view illustrating a functional member 1800 according to an embodiment. Descriptions on elements of the functional member 1800 described with reference to FIG. 10, which are substantially the same as or similar to those of the functional member 800 described with reference to FIG. 9, will not be repeated.

Referring to FIG. 10, in an embodiment, each of the holes HL may be a recessed hole recessed from a surface of the first functional layer 1810. The hole HL may be recessed from the first surface 1811 toward the second surface 1812. In this case, a thickness of the filler 1815 in the third direction DR3 may be less than a thickness of the first functional layer 1810 in the third direction DR3 corresponding to a vertical distance between the first surface 1811 and the second surface 1812.

Figure 11:
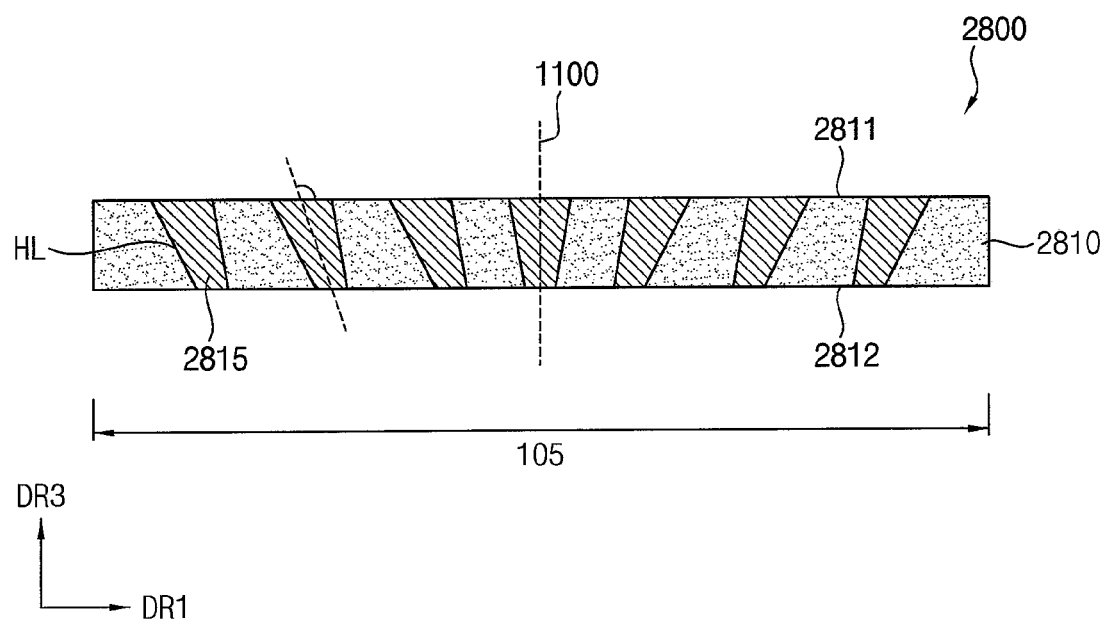
FIG. 11 is a cross-sectional view illustrating a functional member according to an exemplary embodiment of the invention.
Figure 12:
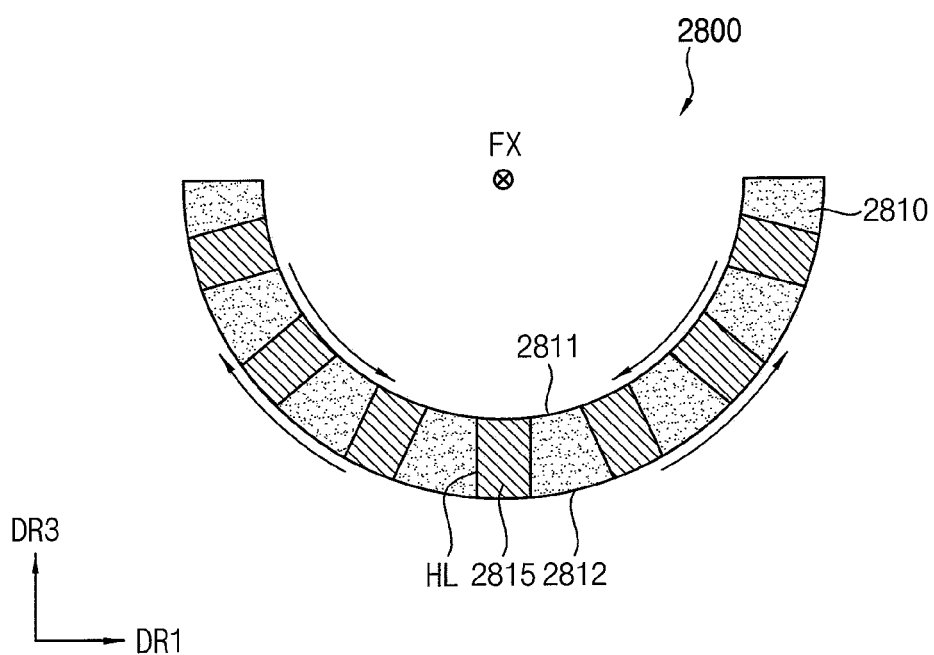
FIG. 12 is a cross-sectional view illustrating a bent state of the functional member in FIG. 11.

FIG. 11 is a cross-sectional view illustrating a functional member 2800 according to an embodiment. FIG. 12 is a cross-sectional view illustrating a bent state of the functional member 2800 in FIG. 11. Descriptions on elements of the functional member 2800 described with reference to FIGS. 11 and 12, which are substantially the same as or similar to those of the functional member 800 described with reference to FIG. 9, will not be repeated.

Referring to FIG. 11, in an embodiment, holes HL may extend obliquely about a center line 1100 with a thickness direction of the first functional layer 2810 from a surface of the first functional layer 2810. In other words, each of the holes HL may extend in a direction between the first direction DR1 and the third direction DR3 from the first surface 2811 of the first functional layer 2810. For example, a direction in which each of the holes HL extends from the first surface 2811 of the first functional layer 2810 may be form an acute angle or an obtuse angle with the first surface 2811. The holes HL may be mirrored around the center line 1100 angled in opposite directions from each other.

Referring to FIG. 12, when the foldable display device is in-folded with respect to a folding axis FX, the functional member 2800 may be bent with respect to the folding axis FX. In this case, a compressive stress may be applied to the first surface 2811 that is an upper surface of the first functional layer 2810, and a tensile stress may be applied to the second surface 2812 that is a lower surface of the first functional layer 2810. In the functional member 2800 according to the present embodiment, each of the holes HL may extend obliquely with the thickness direction of the first functional layer 2810, so that each of the holes HL may extend toward the folding axis FX from a surface of the first functional layer 2810 when the functional member 2800 is bent with respect to the folding axis FX.

Figure 13:
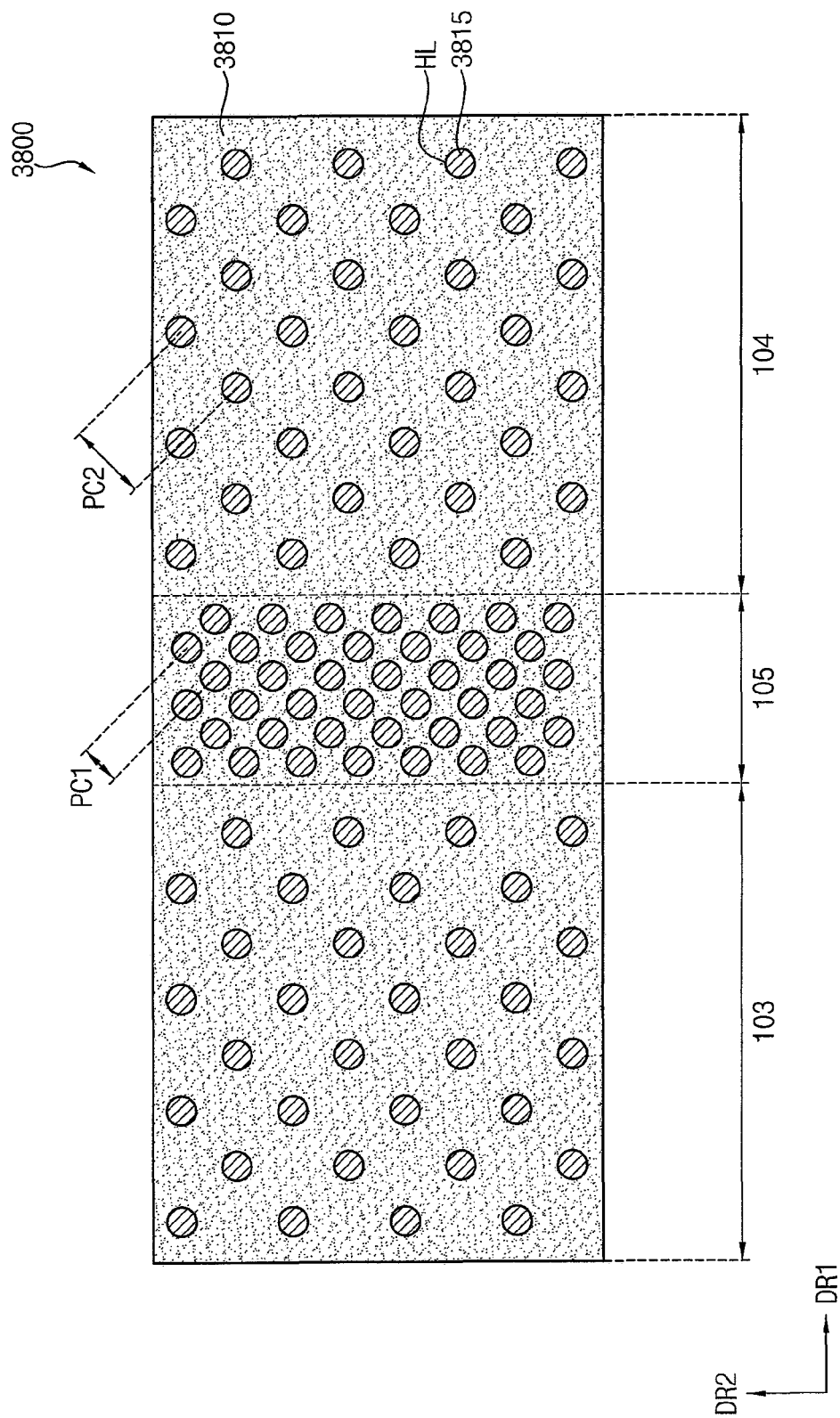
FIG. 13 is a plan view illustrating a functional member according to an exemplary embodiment of the invention.

FIG. 13 is a plan view illustrating a functional member 3800 according to an embodiment. Descriptions on elements of the functional member 3800 described with reference to FIG. 13, which are substantially the same as or similar to those of the functional member 800 described with reference to FIG. 8, will not be repeated.

Referring to FIG. 13, in an embodiment, a pitch PC1 between the holes HL overlapping the bendable portion 105 may be less than a pitch PC2 between the holes HL overlapping the first non-bendable portion 103 and the second non-bendable portion 104. In other words, a gap between adjacent holes HL of the holes HL overlapping the bendable portion 105 may be less than a gap between adjacent holes HL of the holes HL overlapping the first non-bendable portion 103 and the second non-bendable portion 104. For example, the pitch PC1 between the holes HL overlapping the bendable portion 105 may be less than about 200 μm, and the pitch PC2 between the holes HL overlapping the first non-bendable portion 103 and the second non-bendable portion 104 may be greater than about 200 μm.

A tensile stress may be applied to a portion of the functional member 3800 overlapping the bendable portion 105 when the bendable portion 105 of the display panel 100 is bent. In the present embodiment, the pitch PC1 between the holes HL overlapping the bendable portion 105 may be less than the pitch PC2 between the holes HL overlapping the first non-bendable portion 103 and the second non-bendable portion 104, so that a distribution density of the fillers 3815 overlapping the bendable portion 105 may be greater than a distribution density of the fillers 3815 overlapping the first non-bendable portion 103 and the second non-bendable portion 104. Accordingly, buckling of the functional member 3800 may be prevented by the fillers 3815 having a relatively high elastic modulus and overlapping the bendable portion 105.

Figure 14:
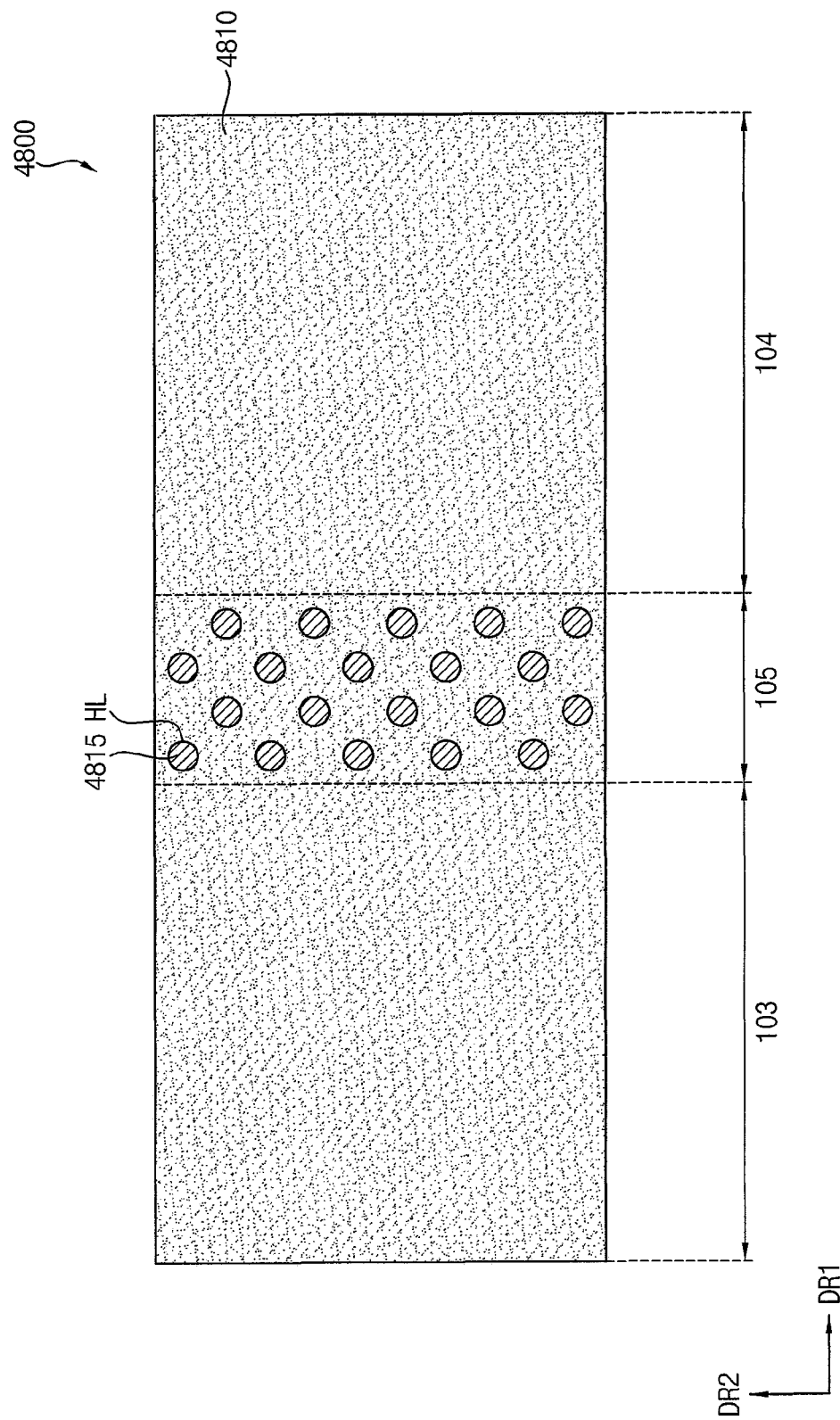
FIG. 14 is a plan view illustrating a functional member according to an exemplary embodiment of the invention.

FIG. 14 is a plan view illustrating a functional member 4800 according to an embodiment. Descriptions on elements of the functional member 4800 described with reference to FIG. 14, which are substantially the same as or similar to those of the functional member 800 described with reference to FIG. 8, will not be repeated.

Referring to FIG. 14, in an embodiment, the holes HL may overlap the bendable portion 105, and may not overlap the first non-bendable portion 103 and the second non-bendable portion 104. In other words, the fillers 4815 filling the holes HL may overlap the bendable portion 105, and may not overlap the first non-bendable portion 103 and the second non-bendable portion 104.

When the foldable display device is folded, the bendable portion 105 of the display panel 100 may be bent, and the first non-bendable portion 103 and the second non-bendable portion 104 may not be bent. Accordingly, a tensile stress due to bending of the display panel 100 may be applied to a portion of the functional member 4800 overlapping the bendable portion 105. The fillers 4815 filling the holes HL may overlap the bendable portion 105, so that buckling of the functional member 4800 due to the tensile stress may be prevented. Further, the fillers 4815 may not overlap the first non-bendable portion 103 and the second non-bendable portion 104, so that an impact resistance of a portion of the functional member 4800 overlapping the first non-bendable portion 103 and the second non-bendable portion 104 may be improved.

Figure 15:
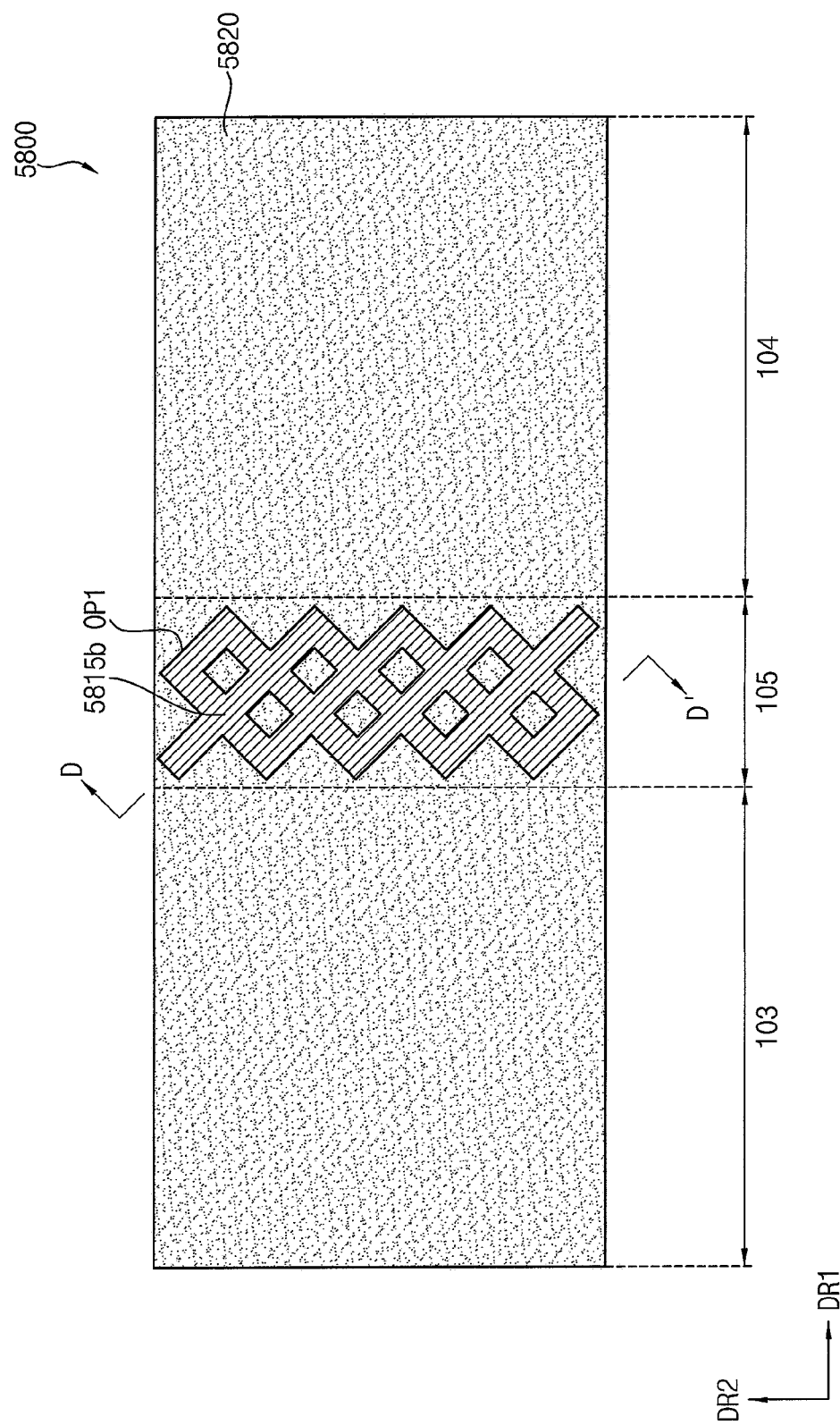
FIG. 15 is a plan view illustrating a functional member according to an exemplary embodiment of the invention.
Figure 16:
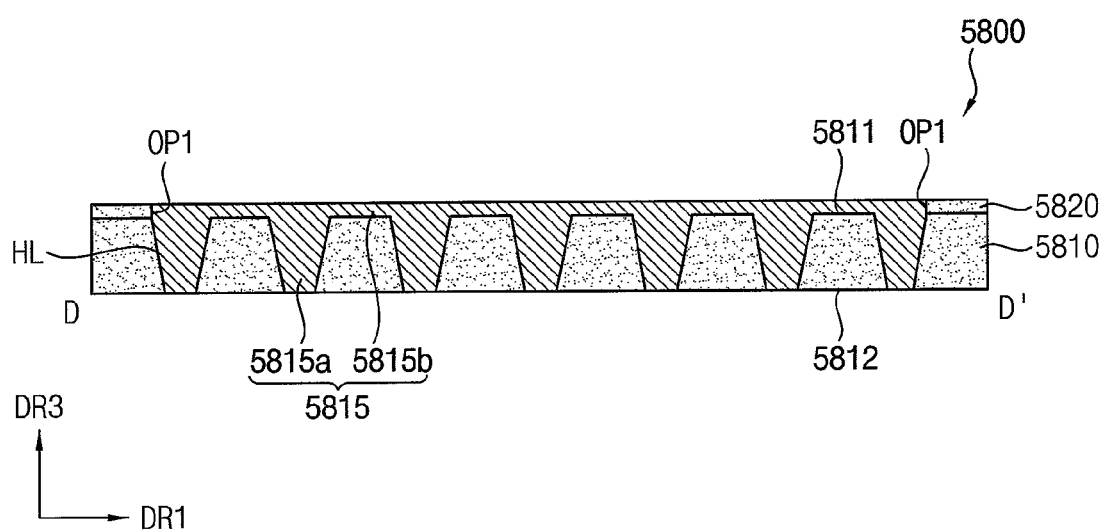
FIG. 16 is a cross-sectional view taken along a line D-D' in FIG. 15.

FIG. 15 is a plan view illustrating a functional member 5800 according to an embodiment. FIG. 16 is a cross-sectional view taken along a line D-D' in FIG. 15. Descriptions on elements of the functional member 5800 described with reference to FIGS. 15 and 16, which are substantially the same as or similar to those of the functional member 800 described with reference to FIGS. 8 and 9, will not be repeated.

Referring to FIGS. 15 and 16, a functional member 5800 according to an embodiment may include a first functional layer 5810, a second functional layer 5820, and a filler 5815. The second functional layer 5820 may be disposed on a first surface 5811 of the first functional layer 5810. A plurality of holes HL may be formed in the first functional layer 5810, and a first opening OP1 overlapping at least two of the holes HL and connecting therebetween may be formed in the second functional layer 5820. The filler 5815 may fill the holes HL and the first opening OP1. The filler 5815 may include first portions 5815a respectively filling the holes HL and a second portion 5815b filling the first opening OP1. For example, the first portion 5815a and the second portion 5815b of the filler 5815 may be integrally formed.

An elastic modulus of the filler 5815 may be greater than an elastic modulus of the second functional layer 5820. In other words, the second functional layer 5820 may have a relatively low elastic modulus, and the filler 5815 may have a relatively high elastic modulus. In an embodiment, the elastic modulus of the second functional layer 5820 may be less than about 1 GPa.

In an embodiment, the second functional layer 5820 may include the same material as that of the first functional layer 5810. For example, the second functional layer 5820 may include elastomer. In such an embodiment, the holes HL and the first opening OP1 may be formed by a laser cutting in the first functional layer 5810 and the second functional layer 5820, respectively, and the holes HL and the first opening OP1 may be filled by the metal or the high elastic resin.

In an embodiment, the first opening OP1 may overlap the holes HL overlapping the bendable portion 105, and may connect therebetween. In such an embodiment, the second portion 5815b of the filler 5815 may overlap the bendable portion 105, and the first portions 5815a of the filler 5815 overlapping the bendable portion 105 may be connected by the second portion 5815b of the filler 5815. The first portions 5815a of the filler 5815 having a relatively high elastic modulus may be connected by the second portion 5815b of the filler 5815, so that deformation of the functional member 5800 due to a stress applied to the functional member 5800 may be reduced or substantially prevented.

Figure 17:
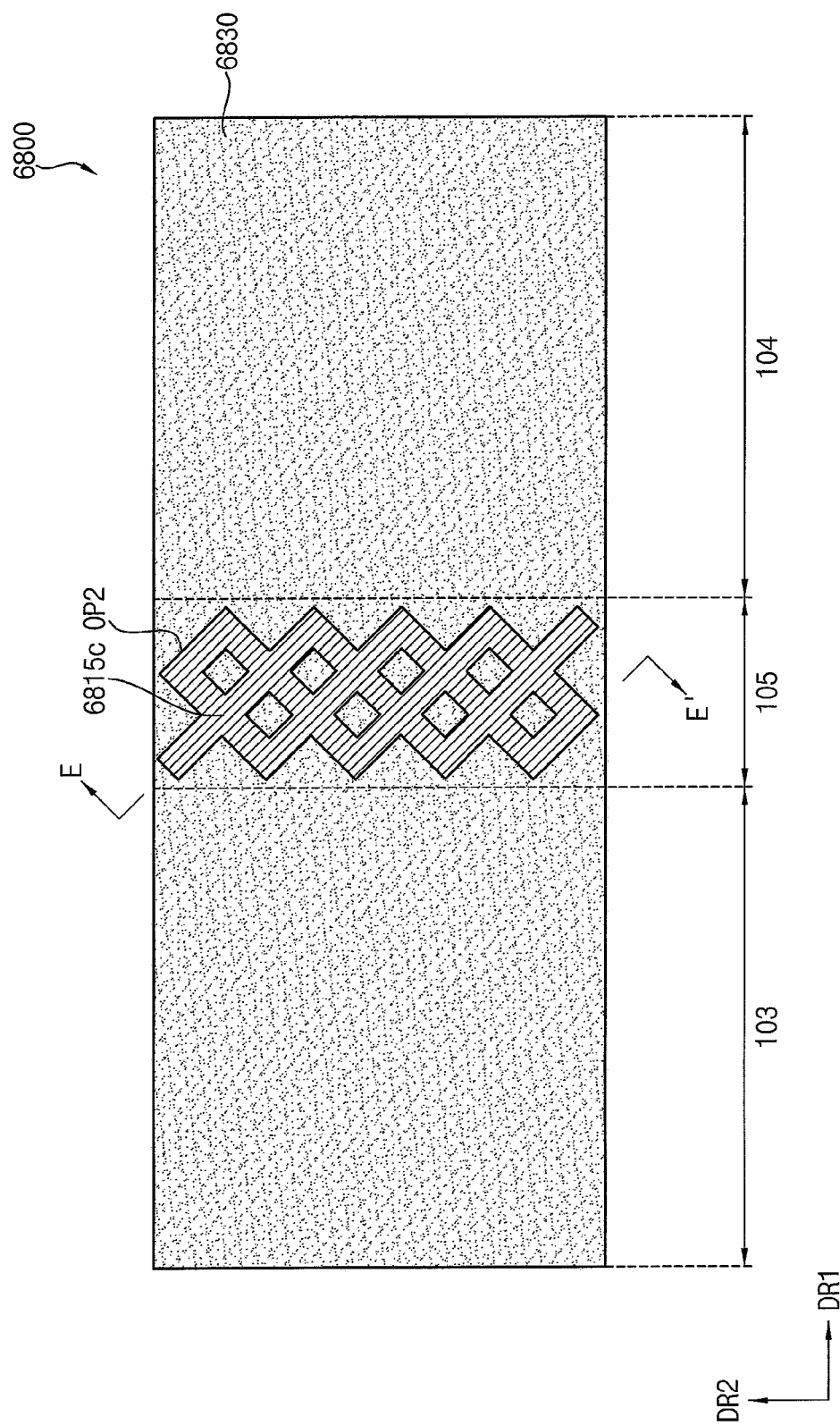
FIG. 17 is a plan view illustrating a functional member according to an exemplary embodiment of the invention.
Figure 18:
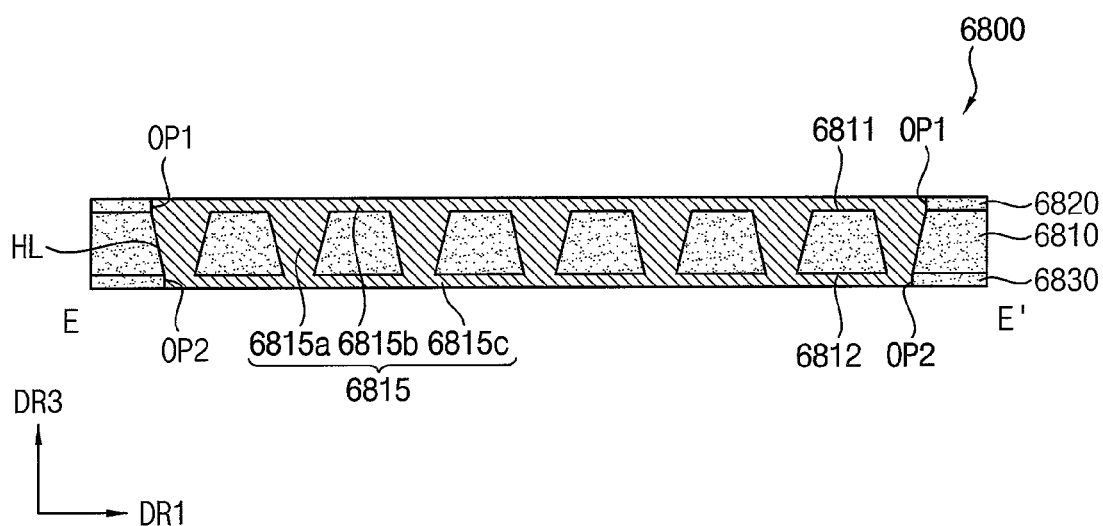
FIG. 18 is a cross-sectional view taken along a line E-E' in FIG. 17.

FIG. 17 is a plan view illustrating a functional member 6800 according to an embodiment. FIG. 18 is a cross-sectional view taken along a line E-E' in FIG. 17. Descriptions on elements of the functional member 6800 described with reference to FIGS. 17 and 18, which are substantially the same as or similar to those of the functional member 5800 described with reference to FIGS. 15 and 16, will not be repeated.

Referring to FIGS. 17 and 18, a functional member 6800 according to an embodiment may include a first functional layer 6810, a second functional layer 6820, a third functional layer 6830, and a filler 6815. The second functional layer 6820 may be disposed on a first surface 6811 of the first functional layer 6810, and the third functional layer 6830 may be disposed on a second surface 6812 of the first functional layer 6810. A plurality of holes HL may be formed in the first functional layer 6810, a first opening OP1 overlapping at least two of the holes HL and connecting therebetween may be formed in the second functional layer 6820, and a second opening OP2 overlapping the first opening OP1 may be formed in the third functional layer 6830. Accordingly, the second opening OP2 may overlap at least two of the holes HL, and may connect therebetween.

The filler 6815 may fill the holes HL, the first opening OP1, and the second opening OP2. The filler 6815 may include first portions 6815a respectively filling the holes HL, a second portion 6815b filling the first opening OP1, and a third portion 6815c filling the second opening OP2. For example, the first portion 6815a, the second portion 6815b, and the third portion 6815c of the filler 6815 may be integrally formed.

An elastic modulus of the filler 6815 may be greater than an elastic modulus of the third functional layer 6830. In other words, the third functional layer 6830 may have a relatively low elastic modulus, and the filler 6815 may have a relatively high elastic modulus. In an embodiment, the elastic modulus of the third functional layer 6830 may be less than about 1 GPa.

In an embodiment, the third functional layer 6830 may include the same material as those of the first functional layer 6810 and the second functional layer 6820. For example, the third functional layer 6830 may include elastomer. In such an embodiment, the holes HL, the first opening OP1, and the second opening OP2 may be formed by a laser cutting in the first functional layer 6810, the second functional layer 6820, and the third functional layer 6830, respectively, and the holes HL, the first opening OP1, and the second opening OP2 may be filled by the metal or the high elastic resin.

In an embodiment, the second opening OP2 may overlap the first opening OP1 overlapping the bendable portion 105. Accordingly, the second opening OP2 may overlap the holes HL overlapping the bendable portion 105, and may connect therebetween. In such an embodiment, the third portion 6815c of the filler 6815 may overlap the bendable portion 105, and the first portions 6815a of the filler 6815 overlapping the bendable portion 105 may be connected by the second portion 6815b and the third portion 6815c of the filler 6815. The first portions 6815a of the filler 6815 having a relatively high elastic modulus may be connected by the second portion 6815b and the third portion 6815c of the filler 6815, so that deformation of the functional member 6800 due to a stress applied to the functional member 6800 may be reduced or substantially prevented.

Hereinafter, a functional member 7800 according to an embodiment will be described with reference to FIGS. 19 and 20.

Figure 19:
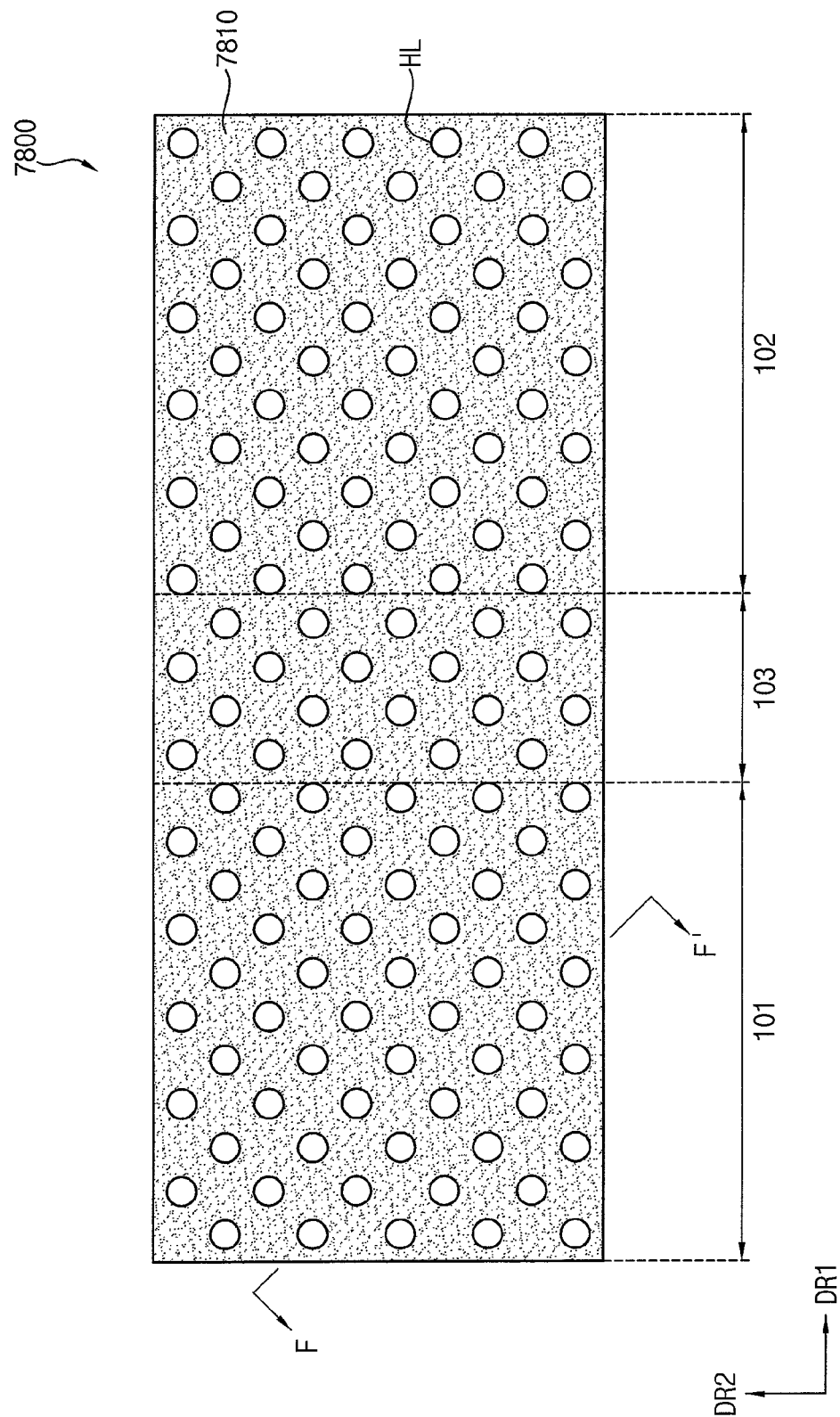
FIG. 19 is a plan view illustrating a functional member according to an exemplary embodiment of the invention.

FIG. 19 is a plan view illustrating a functional member 7800 according to an embodiment. FIG. 20 is a cross-sectional view taken along a line F-F' in FIG. 19. Descriptions on elements of the functional member 7800 described with reference to FIGS. 19 and 20, which are substantially the same as or similar to those of the functional member 800 described with reference to FIGS. 8 and 9, will not be repeated.

Figure 20:
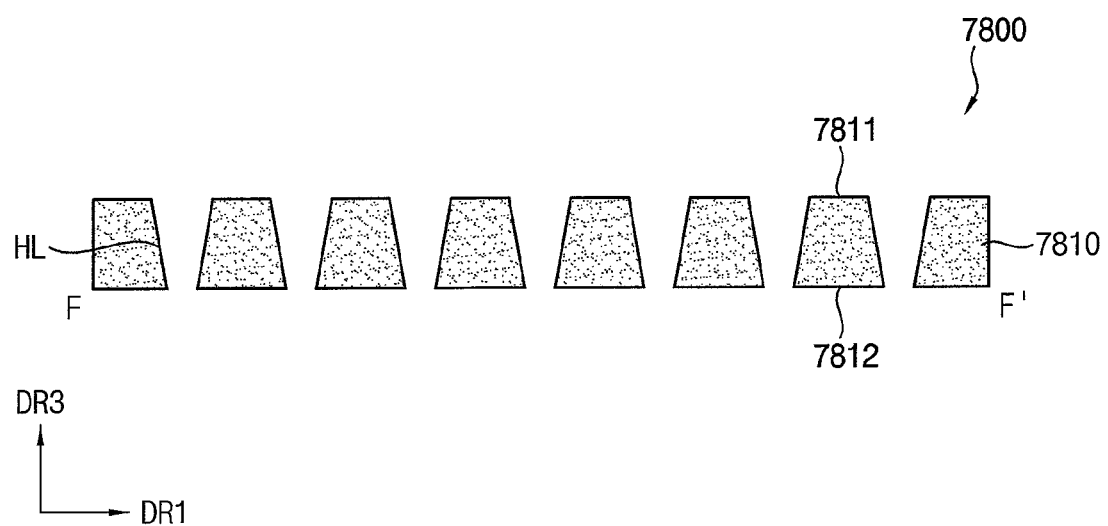
FIG. 20 is a cross-sectional view taken along a line F-F' in FIG. 19.

Referring to FIGS. 19 and 20, the functional member 7800 may include a functional layer 7810. A plurality of holes HL may be formed in the functional layer 7810, and an inside of each of the holes HL may be empty. The holes HL of the functional member 7800 may not be filled by a filler different from the functional member 800 described with reference to FIGS. 8 and 9.

An impact resistance of the functional member 7800 may be improved when the holes HL are not formed in the functional layer 7810 because the elastic modulus of the functional layer 7810 is relatively low. However, buckling of the functional member 7800 may occur when a stress (e.g., a tensile stress) is applied to the functional member 7800 due to folding of the foldable display device. However, in the present embodiment, the holes HL having an empty inside may be formed in the functional layer 7810, so that buckling of the functional member 7800 may be prevented although the stress is applied to the functional member 7800 due to the folding of the foldable display device.

Hereinafter, a functional member 8800 according to an embodiment will be described with reference to FIGS. 21 and 22.

Figure 21:
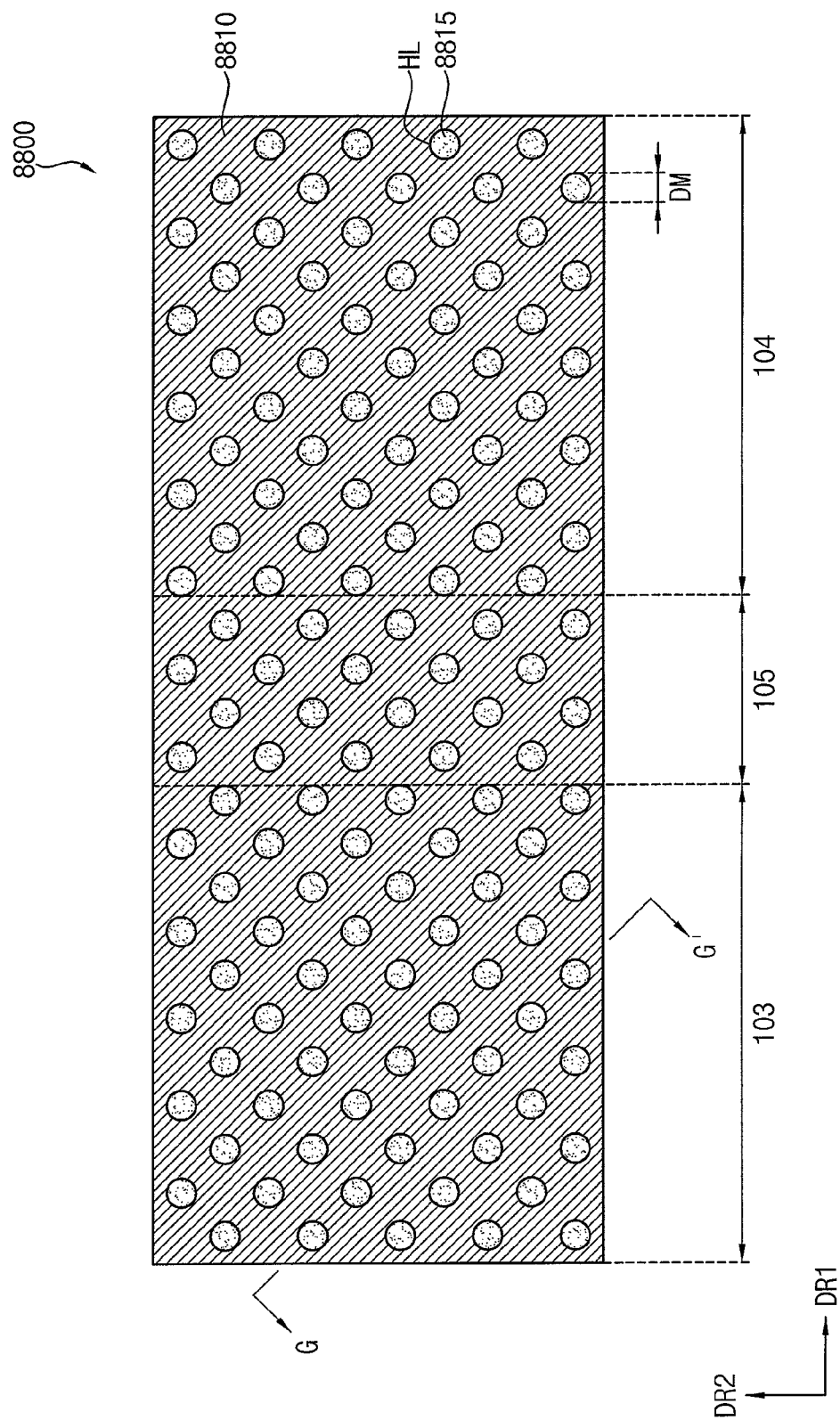
FIG. 21 is a plan view illustrating a functional member according to an exemplary embodiment of the invention.

FIG. 21 is a plan view illustrating a functional member 8800 according to an embodiment. FIG. 22 is a cross-sectional view taken along a line G-G' in FIG. 21. Descriptions on elements of the functional member 8800 described with reference to FIGS. 21 and 22, which are substantially the same as or similar to those of the functional member 800 described with reference to FIGS. 8 and 9, will not be repeated.

Figure 22:
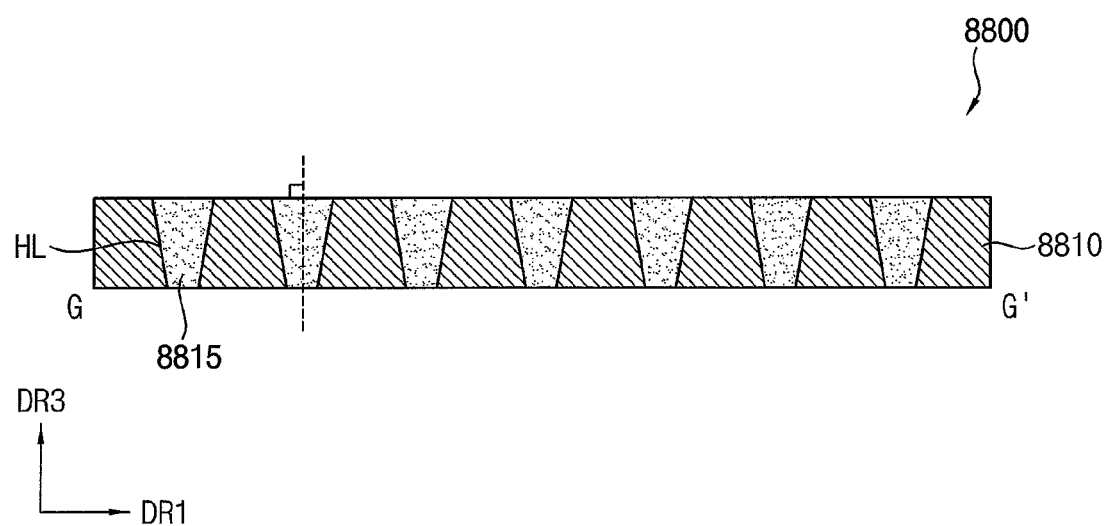
FIG. 22 is a cross-sectional view taken along a line G-G' in FIG. 21.

Referring to FIGS. 21 and 22, the functional member 8800 may include a functional layer 8810 and a filler 8815. A plurality of holes HL may be formed in the functional layer 8810, and the filler 8815 may fill each of the holes HL. Accordingly, the functional member 8800 may include the functional layer 8810 and a plurality of fillers 8815 respectively filling the holes HL.

An elastic modulus of the filler 8815 may be less than an elastic modulus of the functional layer 8810. In other words, the functional layer 8810 may have a relatively high elastic modulus, and the filler 8815 may have a relatively low elastic modulus. In an embodiment, the elastic modulus of the functional layer 8810 may be greater than or equal to about 1 GPa, and the elastic modulus of the filler 8815 may be less than about 1 GPa. Buckling of the functional member 8800 may be prevented when the functional member 8800 includes only the functional layer 8810 because the elastic modulus of the functional layer 8810 is relatively high, however, when external impact is applied to the foldable display device, the external impact may be transferred to the display panel 100 in FIG. 3 due to the decrease of an impact resistance of the functional member 8800. However, in the present embodiment, because the functional member 8800 includes the filler 8815 filling each of the holes HL of the functional layer 8810 and having a relatively low elastic modulus, the functional member 8800 may prevent the external impact from being transferred to the display panel 100 although the external impact is applied to the foldable display device.

In an embodiment, the functional layer 8810 may include metal, and the filler 8815 may include polymer. For example, the metal may be copper (Cu), brass, gold (Au), silver (Ag), aluminum (Al) or stainless steel (SUS). In such an embodiment, the holes HL may be formed by a laser cutting in the functional layer 8810, and the holes HL may be filled by the polymer.

The foldable display device according to the embodiments may be applied to a display device included in a computer, a notebook, a mobile phone, a smartphone, a smart pad, a PMP, a PDA, an MP3 player, or the like.

Although the foldable display device according to the embodiments have been described with reference to the drawings, the illustrated embodiments are examples, and may be modified and changed by a person having ordinary knowledge in the relevant technical field without departing from the technical spirit described in the following claims.

What is claimed is:

1. A foldable display device, comprising:
   a display panel;
   a window disposed on a first surface of the display panel;
   a metal plate disposed on a second surface of the display panel opposite to the first surface; and a functional member disposed between the display panel and the metal plate, the functional member including a first functional layer in which a plurality of holes are formed and a filler filling each of the holes, wherein an elastic modulus of the filler is greater than an elastic modulus of the first functional layer.

2. The foldable display device of claim 1, wherein the first functional layer includes an elastomer, and wherein the filler includes a metal or a high elastic resin.

3. The foldable display device of claim 1, wherein each of the holes has a circular shape in a plan view.

4. The foldable display device of claim 3, wherein a diameter of each of the holes is from 4 μm to 50 μm.

5. The foldable display device of claim 1, wherein each of the holes is a through hole passing through the first functional layer.

6. The foldable display device of claim 1, wherein each of the holes is a recessed hole recessed from a surface of the first functional layer.

7. The foldable display device of claim 1, wherein each of the holes extends parallel to a thickness direction of the first functional layer from a surface of the first functional layer.

8. The foldable display device of claim 1, wherein each of the holes extends obliquely with a thickness direction of the first functional layer from a surface of the first functional layer.

9. The foldable display device of claim 1, wherein the display panel includes a first non-bendable portion, a second non-bendable portion, and a bendable portion between the first non-bendable portion and the second non-bendable portion, and wherein the holes overlap the first non-bendable portion, the second non-bendable portion, and the bendable portion.

10. The foldable display device of claim 9, wherein a gap between adjacent holes of the holes is uniform.

11. The foldable display device of claim 9, wherein a gap between adjacent holes of the holes overlapping the bendable portion is less than a gap between adjacent holes of the holes overlapping the first non-bendable portion and the second non-bendable portion.

12. The foldable display device of claim 9, wherein the metal plate includes a patterned portion overlapping the bendable portion.

13. The foldable display device of claim 1, wherein the display panel includes a first non-bendable portion, a second non-bendable portion, and a bendable portion between the first non-bendable portion and the second non-bendable portion, and wherein the holes overlap the bendable portion and do not overlap the first non-bendable portion and the second non-bendable portion.

14. The foldable display device of claim 1, wherein the functional member further includes a second functional layer disposed on a first surface of the first functional layer and in which a first opening overlapping at least two of the holes and connecting therebetween is formed, and wherein the filler fills the first opening.

15. The foldable display device of claim 14, wherein the functional member further includes a third functional layer disposed on a second surface of the first functional layer opposite to the first surface and in which a second opening overlapping the first opening is formed, and wherein the filler fills the second opening.

16. The foldable display device of claim 1, wherein the functional member is a protective film protecting the second surface of the display panel.

17. The foldable display device of claim 1, further comprising:

a protective film disposed between the display panel and the metal plate; and a cushion layer disposed between the protective film and the metal plate, wherein the functional member is disposed between the protective film and the cushion layer or between the cushion layer and the metal plate.

18. A foldable display device, comprising:

a display panel;

a window disposed on a first surface of the display panel;

a metal plate disposed on a second surface of the display panel opposite to the first surface; and a functional member disposed between the display panel and the metal plate, the functional member including a functional layer in which a plurality of holes are formed, wherein an inside of each of the holes is empty.

19. A foldable display device, comprising:

a display panel;

a window disposed on a first surface of the display panel;

a metal plate disposed on a second surface of the display panel opposite to the first surface; and a functional member disposed between the display panel and the metal plate, the functional member including a functional layer in which a plurality of holes are formed and a filler filling each of the holes, wherein an elastic modulus of the filler is less than an elastic modulus of the functional layer.

20. The foldable display device of claim 19, wherein the functional layer includes a metal, and wherein the filler includes a polymer.

* * * * *